United States Patent [19]

Kumanoya et al.

[11] Patent Number: 4,954,992
[45] Date of Patent: Sep. 4, 1990

[54] RANDOM ACCESS MEMORY HAVING SEPARATE READ OUT AND WRITE IN BUS LINES FOR REDUCED ACCESS TIME AND OPERATING METHOD THEREFOR

[75] Inventors: Masaki Kumanoya; Hirofumi Shinohara; Katsumi Dosaka; Yasuhiro Konishi; Takahiro Komatsu; Hiroyuki Yamasaki, all of Hyogo, Japan

[73] Assignee: Mitsubishi Denki Kabushiki Kaisha, Tokyo, Japan

[21] Appl. No.: 269,757

[22] Filed: Nov. 8, 1988

[30] Foreign Application Priority Data

Dec. 24, 1987 [JP] Japan ................ 62-327940
Jan. 20, 1988 [JP] Japan ................ 63-11257
Feb. 3, 1988 [JP] Japan ................ 63-24284

[51] Int. Cl.$^5$ ............... G11C 7/00; G11C 11/40
[52] U.S. Cl. ........................ 365/207; 365/190; 365/189.01; 365/154; 307/530
[58] Field of Search ........... 365/189.01, 154–156, 365/190, 206, 207, 208; 307/530

[56] References Cited

U.S. PATENT DOCUMENTS

| | | | |
|---|---|---|---|
| 3,940,747 | 2/1976 | Kuo et al. | 365/154 |
| 4,044,340 | 8/1977 | Itoh | 365/190 |
| 4,509,147 | 4/1985 | Tanimura et al. | 365/190 X |
| 4,724,344 | 2/1988 | Watanabe | 365/208 |
| 4,791,324 | 12/1988 | Hodapp | 365/207 |
| 4,803,663 | 2/1989 | Miyamoto et al. | 365/206 |
| 4,843,595 | 6/1989 | Suzuki | 365/207 |
| 4,845,672 | 7/1989 | Waterabe et al. | 365/208 |

FOREIGN PATENT DOCUMENTS 129651 4/1984 European Pat. Off. .
3710536 10/1987 Fed. Rep. of Germany .

OTHER PUBLICATIONS

'87 VLSI Symposium, Digest of Tech. Papers: "BIC-MOS Circuit Technology for High Speed Drams", by S. Watanabe et al, 1987, pp. 79–80.

Primary Examiner—Stuart N. Hecker
Assistant Examiner—Alfonso Garcia
Attorney, Agent, or Firm—Lowe, Price, Leblanc, Becker & Shur

[57] ABSTRACT

A dynamic random access memory device includes a pair of write-in data transferring buses for transferring data to be written, a pair of read-out data transferring buses for transferring data to be read provided additionally and separately from the write-in data transferring bus pair and a plurality of current mirror type sense amplifiers formed of CMOS transistors and each amplifier being provided between a bit line pair and the read-out data transferring bus pair and having input nodes connected to the corresponding bit line pair and the read-out data transferring bus pair forming output nodes thereof. The current mirror type sense amplifiers of CMOS transistors are activated in response to an output of a column decoder at earlier time than the time when conventional flip-flop type sense amplifiers are activated.

13 Claims, 13 Drawing Sheets

SIMPLE DIFFERENTIAL SENSE AMPLIFIER

CURRENT-MIRROR TYPE SENSE AMPLIFIER (SIMPLE DIFFERENTIAL SENSE AMP)

(CURRENT MIRROR TYPE SENSE AMP)

RANDOM ACCESS MEMORY HAVING SEPARATE READ OUT AND WRITE IN BUS LINES FOR REDUCED ACCESS TIME AND OPERATING METHOD THEREFOR

BACKGROUND OF THE INVENTION

1. Field of the Invention

The present invention relates generally to dynamic type semiconductor memory devices having separate read and write buses, and more particularly, to an improved construction thereof and operating method therefor, wherein access time for reading of data from the device is reduced to provide high-speed operation.

2. Description of the Prior Art

Recently, it has been desired in a highly integrated memory device such as a dynamic MOSRAM (i.e., a dynamic random access memory using MOS transistors) to attain a large-scale integration for increasing a storage capacity thereof and to increase a speed of reading operation by considerably reducing access time (i.e., time required for reading of data).

FIG. 1 is a schematic diagram showing an entire construction of a conventional semiconductor memory device. First, the construction will be described in the following.

Referring to FIG. 1, the conventional semiconductor memory device comprises a memory cell array 101 having a plurality of memory cells arranged in rows and in columns to have a folded bit line structure. An address buffer 102 for generating an internal row address and an internal column address upon receipt of an address signal ADD applied externally, a row decoder 103 for selecting memory cells of one row out of the memory cell array 101 upon receipt of the internal row address from the address buffer 102 and a column decoder 104 for selecting memory cells of one column (a bit line pair) out of the memory cell array 101 in response to the internal column address signal from the address buffer 102 are provided for memory cell selection. A block 105 (including a sense amplifier portion and an I/O portion) is provided for amplifying a signal potential difference on the bit line pair and connecting the selected bit line pair to the I/O portion in response to a column decoded signal from the column decoder 104. A write-in buffer 106 for receiving externally applied data $D_{IN}$ to be written and converting the same to a pair of complementary data ($D_{IN}$ and $\overline{D_{IN}}$ for example) to transfer the pair of the data to the I/O portion of the block 105 and a read-out buffer 107 for receiving the data from the I/O portion of the block 105 and outputting the same as an output signal $D_{OUT}$ to outside are provided for writing data into and reading data from a selected memory cell(s). Further, a clock generator 108 for generating signals such as a row address strobe signal $\overline{RAS}$ and a column address strobe signal $\overline{CAS}$ is provided for applying timing to start a memory cycle, to receive an address signal and to effect other operation.

The row address strobe signal $\overline{RAS}$ from the clock generator 108 is applied to the address buffer 102, the row decoder 108 and the like, while the column address strobe signal $\overline{CAS}$ is applied to the address buffer the column decoder 104 and, the like.

As shown in FIGS. 2a–c, the row address strobe signal $\overline{RAS}$ applies timing for accepting a row address in the address buffer 102 and the column address strobe signal $\overline{CAS}$ applies timing for accepting a column address in the address buffer 102. In this configuration, row addresses and column addresses are supplied to the address buffer 102 sequentially. Timing for decoding the address signal in the row decoder 103 and that in the column decoder 104 are determined by the signal $\overline{RAS}$ and $\overline{CAS}$, respectively.

FIG. 3 is a diagram showing a configuration of a main part of the memory cell array portion shown in FIG. 1, an example of a construction of the block 150 indicated by dotted lines being represented in a concrete manner.

FIG. 3 typically shows a pair of bit lines BL and $\overline{BL}$ of the folded bit line structure. In FIG. 3, the pair of bit lines BL and $\overline{BL}$ forms a pair of folded bit lines. In other words, complementary signals appear on the bit lines BL and $\overline{BL}$. A plurality of word lines are provided in a direction perpendicular to the bit lines BL and $\overline{BL}$. In FIG. 3, only a single word line WL is shown typically. Memory cells are provided at intersections of the word lines and the bit lines. The memory cells are arranged in rows and in columns. In FIG. 3, only one memory cell 1 provided at an intersection of the bit line BL and the word line WL is typically shown. The memory cell 1 is of a 1-transistor and 1-capacitor type. It comprises a memory cell capacitor C0 for storing information, and an N channel MOS (metal-oxide-semiconductor) transistor Q0 which is turned on in response to a signal supplied on the word line WL to connect the memory cell capacitor C0 to the bit line BL. A cell plate (an electrode) of the memory cell capacitor is connected at a predetermined potential $V_{SG}$.

Flip-flop sense amplifiers 2 and 3 are provided to differentially amplify the signal potential difference on the pair of bit lines BL and $\overline{BL}$. The sense amplifier 2 comprises N channel MOS transistors Q1 and Q2, which discharge a potential on the lower potential bit line to a ground potential. A gate of the MOS transistor Q1 is connected to the bit line BL and a drain thereof is connected to the bit line BL. A gate of the MOS transistor Q2 is connected to the bit line BL and a drain thereof is connected to the bit line BL. Sources of the MOS transistors Q1 and Q2 are connected to a node N1. The node N1 is connected with a sense amplifier activation means 4 for activating the sense amplifier 2 in response to a sense amplifier activation signal S0. The sense amplifier activation means 4 comprises an N channel MOS transistor Q5 which is turned on in response to the sense amplifier activation signal S0 to connect the node N1 to the ground potential.

The sense amplifier 3 comprises P channel MOS transistors Q3 and Q4, which are activated in response to a signal from a sense amplifier activation means 5 to charge a potential on the higher potential bit line to a power supply potential Vcc. A gate of the MOS transistor Q3 is connected to the bit line $\overline{BL}$ and a gate of the MOS transistor Q4 is connected to the bit line $\overline{BL}$. Conduction terminals of the MOS transistors Q3 and Q4 are connected to the bit lines $\overline{BL}$ and BL, respectively, the other conduction terminals thereof being connected in common to a node N2. An output of the sense amplifier activation means 5 is transferred to the node N2. The sense amplifier activation means 5 is turned on in response to a sense amplifier activation signal $\overline{S0}$. It comprises a P channel MOS transistor Q6 for applying the power supply potential Vcc to the node N2.

There is provided precharge/equalizing means 6 for precharging the pair of bit lines BL and $\overline{BL}$ and equalizing the potentials thereof in response to an equalizing signal EQ. The precharge/equalizing means 6 precharges the respective bit lines to a predetermined potential and equalizing the potentials of the bit lines before start of and after completion of a memory cycle (i.e., in standby time). The precharge/equalizing means 6 comprises: an equalization N channel MOS transistor Q7 which is turned on in response to the equalizing signal EQ to electrically short-circuit the pair of the bit lines $\overline{BL}$ and $\overline{BL}$; a precharge N channel MOS transistor Q8 which applies a precharge potential $V_{BL}$ to the bit line $\overline{BL}$ in response to the equalizing signal EQ; and a precharge N channel MOS transistor Q9 which is turned on in response to the equalizing signal EQ to apply the precharge potential $V_{BL}$ to the bit line $\overline{BL}$. The precharge potential $V_{BL}$ is normally generated by an internal voltage generating circuit and it is set to a predetermined potential (for example, a half of the power supply voltage Vcc, i.e., Vcc/2).

The bit lines BL and $\overline{BL}$ are further connected with N channel MOS transistors Q10 and Q11, respectively, which are turned on in response to a bit line pair selection signal (i.e., a column decode signal) Y from the column decoder (not shown in FIG. 3) to connect the bit lines BL and $\overline{BL}$ to data input/output buses I/O and $\overline{I/O}$. The pair of data input/output buses I/O and $\overline{I/O}$ are precharged at a predetermined potential $V_{BL}'$ by N channel MOS transistors Q22 and Q23 which are turned on in response to a clock signal CLK. The pair of data input/output buses I/O and $\overline{I/O}$ communicate data through input/output buffers.

FIGS. 4a-d are signal waveforms diagram showing reading operation of the conventional semiconductor memory device, the same reference characters as in FIG. 3 representing potential changes in the corresponding portions. Referring to FIGS. 3 and 4, operation of the conventional semiconductor memory device will be described in the following.

Before time T1, the equalizing signal EQ is at a high level and the equalizing transistor Q7 and the precharge transistors Q8 and Q9 are all in the on state, with the bit lines BL and $\overline{BL}$ being precharged at the predetermined potential $V_{BL}$.

When the equalizing signal EQ changes from the high level to a low level at the time T1, the transistors Q7, Q8 and Q9 are all turned off and the precharge/equalizing operation of the bit lines BL and $\overline{BL}$ is terminated to cause the bit lines BL and $\overline{BL}$ to be in an electrically floating state, whereby the device is ready for a start of the next memory cycle.

When a word line WL is selected in response to a row decode signal from the row decoder at time T2, the potential of the word line WL changes from the low level to the high level. As a result, the transistor Q0 of the memory cell 1 to be connected to the word line WL is turned on and the memory capacitor C0 is connected to the bit line BL. Accordingly, a potential change dependent on information of the memory cell 1 occurs in the bit line $\overline{BL}$. If information "1" is stored in the memory cell 1, the potential of the bit line BL becomes slightly higher than the precharge potential as shown by solid lines in FIGS. 4a-d with the potential of the bit line $\overline{BL}$ being maintained at the precharge potential.

If the potential of the read-out signal on the pair of bit lines BL and $\overline{BL}$ becomes stable, the sense amplifier activation signals S0 and $\overline{S0}$ begin to be raised and lowered, respectively, at time T3. Thus, the MOS transistors Q5 and Q6 are turned on, and the node N1 is discharged to the ground potential, while the node N2 is charged to the power supply potential Vcc. As a result, the flip-flop sense amplifiers 2 and 3 are both activated, and the bit line BL of the higher potential out of the pair of bit lines BL and $\overline{BL}$ is charged to the power supply potential Vcc through the sense amplifier 3, while the bit line $\overline{BL}$ of the lower potential is discharged to the ground potential through the sense amplifier 2. Thus, the slight signal potential difference on the pair of bit lines BL and $\overline{BL}$ is amplified by the activation of the sense amplifiers 2 and 3.

When the bit line pair selection signal (i.e., the column decode signal) Y from the column decoder 104 rises to the high level at time T4 after the amplification by the sense amplifiers, the MOS transistors Q10 and Q11 are turned on and the potentials on the bit lines BL and $\overline{BL}$ are applied to the data input/output buses I/O and $\overline{I/O}$. The potentials applied to the data input/output buses I/O and $\overline{I/O}$ are amplified by amplifying means such as preamplifiers, not shown, or the like and then transmitted to an external portion through the data output buffers and external output terminals (not shown), the pair of data buses I/O and $\overline{I/O}$ being in the floating state at the time of transmission of the data.

When the transmission of the data to the external output terminals is completed, the potential of the word line WL changes from the high level to the low level at time T5 and the level of the bit line pair selection signal Y also changes from the high level to the low level. As a result, the potential on the pair of data input/output buses I/O and $\overline{I/O}$ returns to the precharge potential $V_{BL}'$.

Then, at time T6, sense amplifier activation signals S0 and $\overline{S0}$ change from the high level to the low level and from the low level to the high level, respectively, so that the sense amplifiers 2 and 3 are both in a non-active state. At the same time, the equalizing signal EQ rises to the high level to activate the precharge/equalizing means 6 and, thus, the bit lines BL and $\overline{BL}$ are precharged to the predetermined potential $V_{BL}$ and the potentials on the pair of the bit lines BL and $\overline{BL}$ are equalized.

Thus, the outline of the data reading operation was described. On the other hand, in data writing operation, timing of a signal waveform is the same as shown in FIG. 4 and the data flows in a direction opposite to that in the case of the reading operation, i.e., in the direction from the data input buffers to a selected memory cell through the pair of data input/output buses. More specifically, the data input buffers to a selected memory cell through the pair of data input/output buses. More specifically, the data to be written, supplied from an external portion through the data write-in buffer (not shown) are transferred to the data input/output buses I/O and $\overline{I/O}$ in a complementary form (such as $D_{IN}$ and $\overline{D_{IN}}$). After sequential operations from the time T1 to the time T3, the bit line selection signal Y changes from the low level to the high level at the time T4. Then, the MOS transistors Q10 and Q11 are turned on and the signal potentials on the data input/output buses I/O and $\overline{I/O}$ are applied to a selected memory cell, whereby the data is written, In this case, the sense amplifiers 2 and 3 are activated at the time T3 and the signal potential difference on the bit lines BL and $\overline{BL}$ is amplified after the change of the word line WL to the high level. However, even if the signal level amplified by the sense amplifiers 2 and/or 3 is opposite to the signal potential level of the write-in data, the signal potential according to the write-in data appears on the bit lines BL and $\overline{BL}$ since the write-in data is transferred onto the data input/output buses I/O and $\overline{I/O}$ through the external data input buffer. More specifically, the drivability of the data input buffer (or write-in buffer) is designed to be larger than the latching ability of the sense amplifiers, and therefore write-in data can reverse the data latched by a sense amplifier. Thus, the write-in data is written into the selected memory cell through the MOS transmitter Q0 in the on state.

As described above, in the construction of the conventional, semiconductor memory device, data is read out and written from and into the corresponding memory cell through the same data input/output bus pair I/O and $\overline{I/O}$. Accordingly, even in reading data, the pair of the bit lines BL and $\overline{BL}$ are connected with the pair of the data input/output buses I/O and $\overline{I/O}$ through the MOS transistors Q10 and Q11, respectively. In order to read data at high speed, it is preferable to connect the pair of the bit lines with the pair of the data input/output buses as fast as possible. However, if the connection between the pair of the bit lines and the pair of the data input/output buses is made in a period from the time T2 for raising the potential of the word line WL to the time T3 for starting sensing operation by activating of the sense amplifiers 2 and 3 for example as shown in FIG. 4, load capacitance of the data input/output buses is applied to the bit lines to cause the read-out signal level on the bit lines to be lowered. As a result, the sense amplifiers could not perform stable sensing operation and erroneous operation might occur. Accordingly, it is necessary to connect the bit line pair with the data input/output bus pair after the sense amplifiers 2 and 3 are activated and the signal potentials on the bit lines BL and $\overline{BL}$ become stable. The connection between the selected pair of the bit lines and the pair of the data input/output buses can not be made before the time T3 on reading out data. Consequently, the conventional device involves disadvantages that increase of speed in reading operation is limited and that it is difficult to reduce access time. More specifically, if the conventional device has the construction using the same pair of the data input/output buses for reading and wiring of data, it is difficult to reduce access time in the data reading operation.

S. Watanabe et al. propose, in "BiCMOS CIRCUIT TECHNOLOGY FOR HIGH SPEED DRAMs", '87 VLSI SYMPOSIUM, Digest of Technical Papers, 1897, pp. 79-80, a DRAM with a write data bus and a read data bus separately provided for the purpose of high-speed reading. In Watanabe's DRAM, a BiCMOS differential sense amplifier separate from a conventional flip-flop type sense amplifier is additionally provided between the read-data bus and respective bit line pairs.

FIG. 5 shows the circuit diagram of DRAM disclosed by Watanabe et al. in the above prior art reference.

Referring to FIG. 5, the write-data bus IL, $\overline{IL}$ and the read-data bus OL, $\overline{OL}$ are separately provided on each side of the bit lines. The bit lines BL, $\overline{BL}$ are isolated from the write data bus IL, $\overline{IL}$ in a reading mode in response to a signal WRITE. Between the read-data bus and a bit line pair a BiCMOS differential sense amplifier is provided. The input stage of the BiCMOS sense amplifier is connected through clocked inverters with paired bit lines. Between the read-data bus and a data output ($D_{OUT}$) buffer a level shift circuit for shifting a signal voltage level on the read-data bus OL, $\overline{OL}$ and another BiCMOS sense amplifier for differentially amplifying the output of the level shift circuit to apply the same to the $D_{OUT}$ buffer.

The write-data bus comprises a pair of signal lines IL and $\overline{IL}$ connected to a bit line BL and a complementary bit line $\overline{BL}$, respectively. Similarly, the read-data bus comprises a pair of signal line OL and $\overline{OL}$ for receiving data frame the bit line BL and the complementary bit line $\overline{BL}$, respectively, through the BiCMOS differential amplifier. In FIG. 5, the signals CSL1 and CSL2 denotes column decoded signals from a column decoder (not shown). Operation of the DRAM is described where a memory cell storing data of "0" is selected to be connected to the bit line BL1, referring to FIG. 6 showing a waveform of the main nodes at a reading operation.

In reading, the signal WRITE is at a low level to isolate all of the bit lines from the write-data bus. First, a word line WL is selected in response to an externally applied row address to be activated. Then, data stored in the memory cells connected to the selected word line WL are transferred to the corresponding bit liens BL1, BL2 . . . , resulting in a small change of voltage on the bit lines depending on transferred data. This small change of the bit line voltage causes a conductance modulating of the clocked CMSO inverter. This conductance modulation is applied tot he input stage of the BiCMOS sense amplifier in response to the column decoded signal CSL1. Then, the BiCMOS sense amplifier is already activated by the signal CSL1 to amplify the received small signal in a short period of time owing to its high current drivability. Data on the bit line BL1 is transferred to the read-data line OL. The signal voltage on the read-data line OL is shifted in the level and amplified by the next circuit of the level shift circuit and the another BiCMSO differential amplifier.

The amplified data RD, $\overline{RD}$ is applied to the $D_{OUT}$ buffer. Then the data $D_{OUT}$ is outputted from the $D_{OUT}$ buffer. At the same time, the conventional flip-flop type sense amplifier is activated to restore memory cell data. Thus, the data of the selected memory cell is read out before or at the same time of activation of the conventional flip-flop type sense amplifiers, providing high speed reading.

In writing the signal WRITE is at a high level, and writing data is performed through the write-data bus IL, $\overline{IL}$ in the same manner as that in the conventional DRAM shown in FIG. 3.

In this prior art, however, every bit line is not directly connected to the input stage of the BiCMOS sense amplifier, but indirectly connected thereto through the clocked inverter.

A clocked inverter typically comprises the circuit configuration as shown in FIG. 7. The clocked inverter consists of a CMOS inverter formed of complimentarily connected P channel MOS load transistor QP1 and N channel MOS driver transistor QND and cut-off switch transistors QPC and QNC which are connected to the power supply Vc and the ground, respectively. The cut-off switch transistors QPC and QNC inhibit the operation of the inverter (that is, inversion of a received input IN to an output OUT) when the control clock CLOCK is at a low level and the complement thereof $\overline{CLOCK}$ is at a high level. On the other hand, the clocked inverter acts as a normal inverter when the control clock CLOCK goes high.

One reason why the prior art uses the clocked inverter in addition to the BiCMOS differential sense amplifier is that input impedance of a bipolar transistor is in general considerably lower than that of an MOS transistor.

Thus, an isolating device is required to avoid adverse interference to a bit line voltage and therefore to the amplifying operation of a conventional CMOS flip-flop type sense amplifier.

Another reason is to supply the base current to the bipolar transistors in the BiCMOS differential sense amplifier and pre-amplify the input swing of the simple differential sense amplifier.

Consequently, the prior art has a disadvantage in delaying the read operation because a clocked inverter is inevitably required and hence the read operation thereof is inherently delayed by the inverter Further, the clocked inverter comprises at least four transistors, leading to another disadvantage in view of area consumption in achieving a larger scale integration.

Furthermore, the simple differential sense amplifier of the prior art is not sufficient for the high speed operation because it does not have a positive feed-back to accelerate the amplification of the input voltage to supply the output voltage.

SUMMARY OF THE INVENTION

One object of the invention is to provide a dynamic RAM and operating method therefore having reduced access time for carrying out reading operation.

Another object of the invention is to provide, in a dynamic RAM having separate read and write buses and differential amplifier readout of bit line information to the read bus, an improvement wherein readout rate to the read bus is increased.

Another object is to provide an improved dynamic RAM of a type having separate read and write buses, wherein fabrication thereof is simplified by providing a CMOS buffer amplifier to read from the bit lines to the bus.

A further object of the invention is to provide a dynamic RAM of a type having separate read and write buses and buffer amplifiers for reading bit line information to the read buses, wherein the buffer amplifiers are composed only of MOS transistors and the amount of current that must be carried by the amplifiers is reduced.

Another object is to provide a DRAM of a type having separate read and write buses, wherein the bit lines are directly connected to the buffer amplifier but wherein no interference to the bit lines is applied by the read bus.

A still further object is to provide operating method therefore.

A semiconductor memory device in accordance with the present invention comprises: a pair of data buses for transferring data to be written (hereinafter referred to as a write-in data transferring bus pair), a pair of data buses for transferring data to be read (hereinafter referred to as a read-out data transferring bus pair), provided separately from the write-in data transferring bus pair, and a current mirror type sense amplifier provided for each bit line pair and having an input portion consisting of the corresponding bit line pair and an output portion consisting of the read-out data transferring bus pair, so as to be activated in response to an output of a column decoder.

Preferably, the read-out data transferring bus pair comprises a plurality of sub read-out data transferring bus pairs provided in common for a predetermined number of bit line pairs, and a main read-out data transferring bus pair provided in common for all of the plurality of sub read-out data transferring bus pairs for receiving a signal therefrom. The output portion of the current mirror type sense amplifier is connected with the corresponding one of the sub read-out data transferring bus pairs.

Preferably, a row decoder input portion for receiving an externally applied row address and transferring the same to a row decoder, and a column decoder input portion for receiving an externally applied column address and transferring the same to a column decoder are provided separately.

In the above described structure, the current mirror type sense amplifier performs high-speed operation to amplify a slight difference in potential on the bit line pair and to transfer the amplified difference to the read-out data transferring bus pair without causing unfavorable influence to the potential on the bit lines, because it has a high input impedance. Accordingly, information contained in a selected memory cell can be read out before the flip-flop type sense amplifier is activated.

In addition, if the read-out data transferring bus pair comprises a main data transferring bus pair and sub data transferring bus pairs, load capacitance of an output portion of the current mirror type sense amplifier can be decreased, which makes it possible to perform reading operation at higher speed.

Further, if a column address input portion and a row address input portion are provided separately, column decoding operation and row decoding operation can be performed simultaneously, which makes it possible to read data immediately after a rise of a potential of a selected word line.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 8:
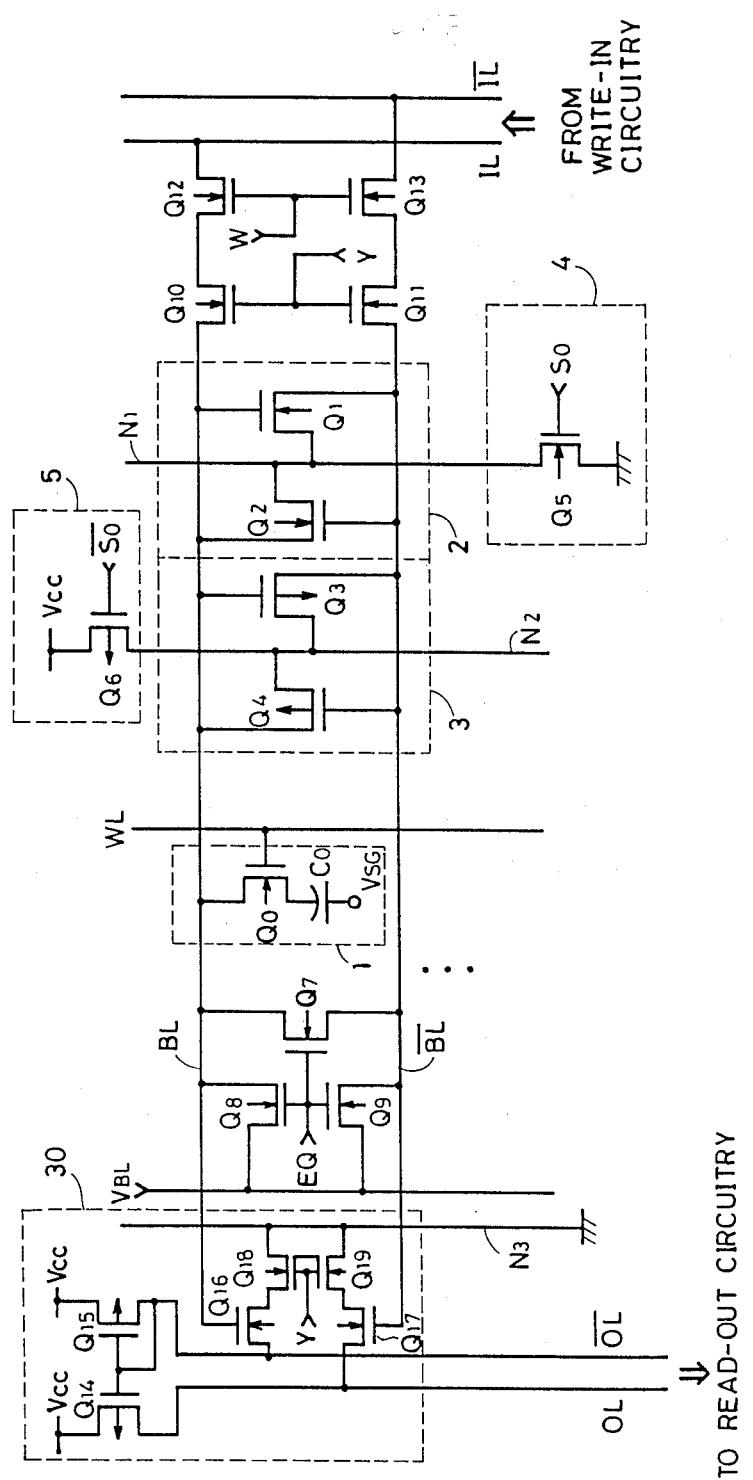
FIG. 8 is a diagram showing a configuration of a main part of a semiconductor memory device according to an embodiment of the present invention.

FIG. 8 is a diagram showing a configuration of a main part of a semiconductor memory device according to an embodiment of the present invention, portions associated with a pair of bit lines being represented typically.

Referring to FIG. 8, a pair of the bit lines BL and $\overline{BL}$ form a folded bit line structure, which is similar to that of the conventional semiconductor memory device. There are provided, in association with the pair of bit lines BL and $\overline{BL}$, flip-flop type sense amplifiers 2 and 3 activated by sense amplifier activation circuits 4 and 5, respectively, transistors Q10 and Q11 for connecting the selected pair of bit lines BL and $\overline{BL}$ to a data bus pair in response to a column decoder output signal Y, an equalizing MOS transistor Q7 for equalizing potentials of the pair of bit lines BL and $\overline{BL}$, and precharge MOS transistors Q8 and Q9 for precharging the bit line pair. The sense amplifier activation circuit 4 comprises an N channel MOS transistor Q5 which is turned on in response to a sense amplifier activation signal S0 to connect a node N1 to a ground potential. The sense amplifier activation circuit 5 comprises a P channel MOS transistor Q6 which is turned on in response to a sense amplifier activation signal $\overline{S0}$ to connect a node N2 to a power supply potential Vcc. A memory cell 1 has a 1-transistor and 1-capacitor type structure. It comprises a memory capacitor C0 for storing information in the form of electric charges, and an MOS transistor Q0 for connecting the memory capacitor C0 to the bit line $\overline{BL}$ in response to a potential on a word line WL. A cell plate of the capacitor C0 is connected to a voltage $V_{SG}$.

There is further provided a current mirror type amplifier 30 corresponding to each bit line pair to enable high-speed reading. The current mirror type amplifier 30 has input nodes connected to the bit lines BL and $\overline{BL}$ and an output node consisting of a read-out data transferring bus pair OL and $\overline{OL}$. The current mirror type amplifier 30 comprises a first amplifying inverter formed of a P channel MOS transistor Q15 and an N channel MOS transistor Q16 and a second amplifying inverter formed of a P channel MOS transistor Q14 and an N channel MOS transistor Q17. The amplifier 30 also comprises activating N channel MOS transistors Q18 and Q19 receiving a column decoded signal Y at respective gates. Further, the amplifier 30 comprises a positive feed back provided between the gates of the transistors Q14 and Q15 and the output of the first inverter (or a junction of the transistors Q15 and Q16). P channel MOS transistor Q14 has one conduction terminal connected to the power supply potential Vcc and the other conduction terminal to the read-out data transferring bus OL. P channel MOS transistor Q15 has one conduction terminal connected to the power supply potential Vcc and the other conduction terminal connected to the read-out data transferring bus $\overline{OL}$ as well as to the gate thereof and the gate of the transistor Q14. N channel MOS transistor Q16 has one conduction terminal connected to the read-out data transferring bus OL and a gate connected to the bit line $\overline{BL}$. N channel MOS transistor Q17 has one conduction terminal connected to the read-out data transferring bus OL and a gate connected to the bit line $\overline{BL}$. N channel MOS transistor Q18 has one conduction terminal connected to the other conduction terminal of the transistor Q16, the other conduction terminal connected to the ground potential through a node N3 and a gate connected to receive a column decoder output signal Y. N channel MOS transistor Q19 has one conduction terminal connected to the other conduction terminal of the transistor Q17, the other conduction terminal connected to the ground potential through the node N3 and a gate connected to receive the column decoder output signal Y. In this structure, the bit lines BL and $\overline{BL}$ constitute an input gate of the current mirror type amplifier 30, and the read-out data transferring bus lines OL and $\overline{OL}$ constitute an output nodes of the current mirror type amplifier 30. The amplifying portions formed by the transistors Q16 to Q19 are provided for each bit line pair. Constant current supply portions formed by the transistors Q14 and Q15 are provided in common for the pair of the data buses OL and $\overline{OL}$, that is, for all the amplifying portions. The current mirror type amplifier is provided in view of capabilities for provision of reduced power consumption, high-speed operation and electric isolation between the read-out data transferring bus line pair (the output portion) and the bit line pair (the input portion).

Further, N channel MOS transistor Q12 and Q13 which are turned on in response to a write instruction signal W to connect the selected bit line pair to a write-in data transferring bus pair IL and $\overline{IL}$ are provided between the transistors Q10 and Q11 and the data buses IL and $\overline{IL}$. More specifically, the data buses IL and $\overline{IL}$ are used only for the purpose of transferring data to be written in the selected memory cell in data writing operation and those buses are connected to the selected bit line pair only in data writing operation.

Thus, in the above described structure, the write-in data transferring buses IL and $\overline{IL}$ and read-out data transferring buses OL and $\overline{OL}$ are provided separately, which makes it possible to perform reading operation at high speed.

Figure 9:
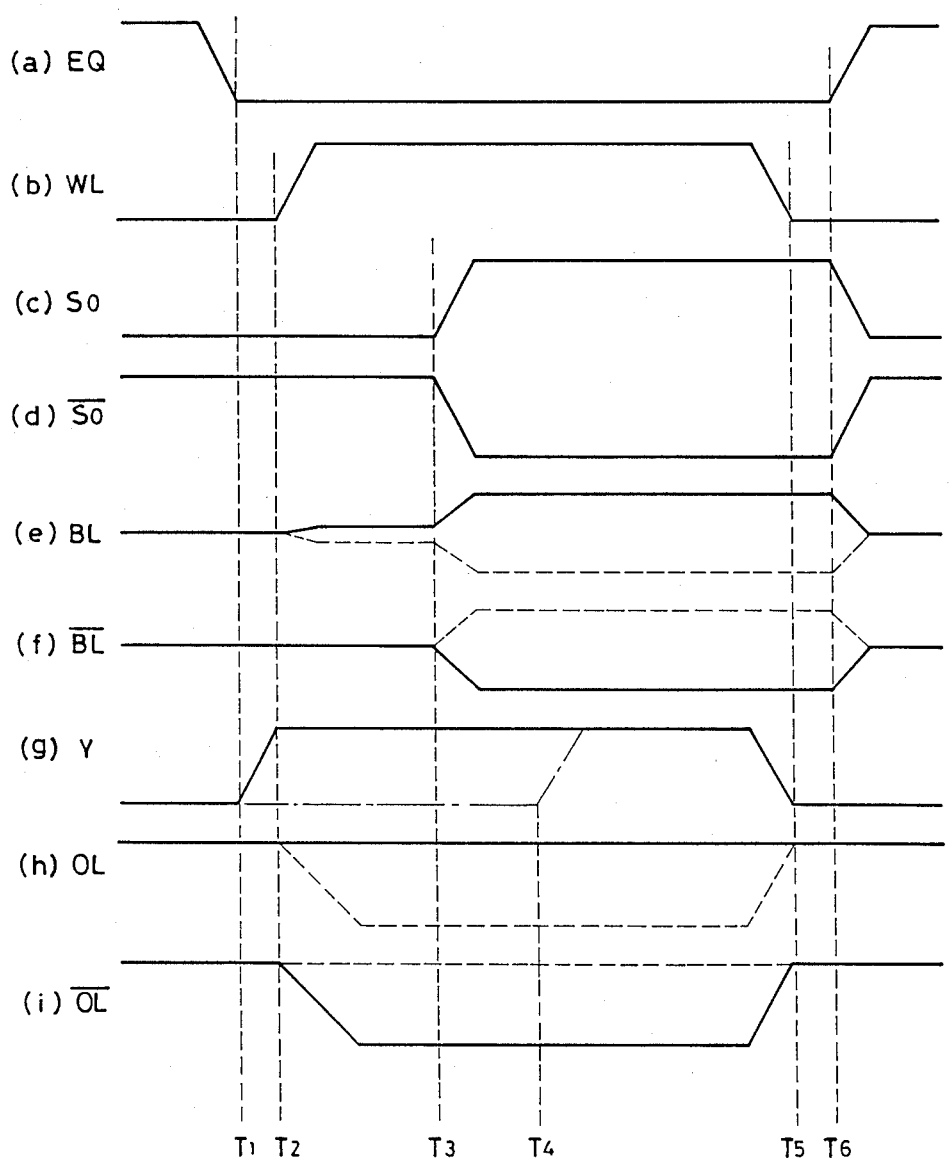
FIGS. 9a-d are the waveform diagrams showing operation of the semiconductor memory device of FIG. 8.

FIG. 9 is a waveform diagram showing operation of the semiconductor memory device shown in FIG. 8, the same reference characters as in FIG. 8 representing signal potential changes in the corresponding portions. Referring now to FIGS. 8 and 9, operation of the semiconductor memory device of this embodiment will be described.

First, in a data read operation mode, the write instruction signal W is at the low level and the transistors Q12 and Q13 are both in the off state. Thus, the bit lines BL and $\overline{BL}$ are isolated from the write-in data transferring bus lines IL and $\overline{IL}$.

Before the time T1, the equalizing signal EQ is at the high level in the same manner as in the conventional semiconductor memory device and the bit lines BL and $\overline{BL}$ are precharged at the predetermined precharge potential $V_{BL}$ through the transistors Q7 to Q9.

When the equalizing signal EQ changes from the high level to the low level at the time T1, the equalizing transistor Q7 and the precharge transistors Q8 and Q9 are all turned off and the bit lines BL and $\overline{BL}$ are brought into an electrically floating state.

When the word line WL is selected based on a row address from the address decoder (not shown in FIG. 8 at the time T2 and the potential of the selected word line WL changes from the low level to the high level, the transistor Q0 of the memory cell 1 is turned on and information contained in the memory cell 1 is transferred onto the bit line BL. If the memory capacitor Co of the memory cell 1 stores information "1", the potential of the bit line BL becomes slightly higher than the precharge potential as shown by the solid line in the waveform diagram of FIG. 9, with the potential of the bit line $\overline{BL}$ being maintained at the precharge potential. If the bit line pair selection signal (i.e., the column decode signal) Y from the column decoder (not shown in FIG. 8) changes from the low level to the high level at the time T1 as shown in FIG. 9 for example, the transistors Q18 and Q19 are turned on and the current mirror type amplifier 30 is activated. Accordingly, as shown in FIG. 9, if the potential of the word line WL rises to cause a slight change in the potential of the bit line BL (, or $\overline{BL}$) with the current mirror type amplifier 30 being in the activated state at the time of T2, the change in the bit line potential is amplified at high speed in the current mirror type amplifier 30 to be transferred to the output nodes OL and $\overline{OL}$. Thus, as shown in FIG. 9, if the memory cell 1 has the information "1", the read-out data transferring bus line $\overline{OL}$ is discharged to a predetermined low level at high speed through the transistors Q16 and Q18. On the other hand, the potential of the read-out data transferring bus line OL is maintained at the power supply potential $V_{cc}$. Consequently, a signal corresponding to read-out data is transferred onto the read-out data transferring bus lines OL and $\overline{OL}$. This data is transferred to a read-out circuit such as a read-out buffer not clearly shown in the drawing and it is immediately transferred to an external data output terminal. Since, in the current mirror type amplifier 30, the bit lines and $\overline{BL}$ are connected to the gates of the MOS transistors Q16 and Q17, respectively, and the read-out data transferring bus lines OL and $\overline{OL}$ of the output nodes are connected to the conduction terminals of the transistors Q16 and Q17, respectively, the pair of the bit lines BL and $\overline{BL}$ and the pair of the read-out data transferring bus lines OL and $\overline{OL}$ are not directly connected with each other. Accordingly, the load capacitance of the read-out data transferring bus lines OL and $\overline{OL}$ and the potential levels thereof cause no influence to the potentials of the bit lines BL and $\overline{BL}$. In addition, since the write-in data transferring bus lines IL and $\overline{IL}$ are isolated from the bit lines BL and $\overline{BL}$ through the transistors Q12 and Q13, the load capacitance of the pair of the write-in data transferring bus lines IL and $\overline{IL}$ do not cause any unfavorable influence to the potentials on the bit line BL and BL. Consequently, a very small change in the potential on the bit lines BL and $\overline{BL}$ can be detected even immediately after the rise of the potential of the word line WL and information can be read out with precision at high speed. Thus, access time in reading operation can be considerably reduced and high-speed access for reading can be attained. Advantages of the current mirror type sense amplifier are discussed later in detail.

At the time of T3, the sense amplifiers 2 and 3 are activated in response to sense amplifier activation signals S0 and $\overline{S0}$ and the slight signal potential difference on the pair of the bit lines BL and $\overline{BL}$ is further increased. The amplification operation for the bit line potential by the sense amplifiers 2 and 3 is performed mainly for restoring operation to rewrite read-out information into the selected memory cell 1.

When the potential of the word line WL and the column decoder output signal Y change from the high level to the low level at the time T5, the current mirror type amplifier 30 is also brought into non-activated state. As a result, the potentials on the read-out data transferring bus lines OL and $\overline{OL}$ are also charged to the predetermined precharge potential through the transistors Q14 and Q15.

When the sense amplifier activation signals S0 and $\overline{S0}$ are brought into the non-activated state at the time T6, the flip-flop type sense amplifiers 2 and 3 are also brought into non-activated state. At the same time, the equalizing signal EQ rises from the low level to the high level and accordingly the bit lines BL and $\overline{BL}$ are precharged again to the predetermined precharge potential $V_{BL}$ through the transistors Q7 and Q9.

In the foregoing, the case of the selected memory cell 1 having the information "1" was described. If the selected memory cell 1 has information "0", a waveform as shown by dotted lines in FIG. 9 is obtained.

In data writing cooperation, the write instruction signal W is set at the high level and the transistors Q12 and Q13 are both in the on state. At this time, externally applied write-in data from a writ-in circuit such as a write-in buffer are transferred in a complementary form (for example, $D_{IN}$ and $\overline{D_{IN}}$) to the write-in data transferring bus lines IL and $\overline{IL}$.

The sequential operations from the time T1 to the time T4 are the same as in the case of data writing operating in the conventional device. If the column decoder output signal Y changes from the low level to the high level at the time T4 as shown by broken lines in FIG. 9 to select the pair of the bit line BL and $\overline{BL}$, the transistors Q10 and Q11 are turned on and the pair of the bit lines BL and $\overline{BL}$ are connected with the pair of the write-in data transferring buses IL and $\overline{IL}$. As a result, the potential on the pair of the write-in data transferring buses IL and $\overline{IL}$ is written in the selected memory cell 1 oppositely to the case of reading operation. Although it was stated above that the column decoder output signal Y rises from the low level to the high level at the time T4 in writing operation, the change of the column decoder output signal Y to the high level is not limited to that timing and the change may be made with earlier timing.

In addition, although it was stated in the foregoing that the column decoder output signal Y rises to the high level at the same time with the change of the equalizing signal EQ to the low level in reading operation, the change of the column decoder output signal Y to the high level may be made later than at timing. In any case, the column decode output signal Y can change to the high level before start of sensing operation in reading operation and data can be read out at high speed.

In the above description, the current mirror type amplifier 30 is activated also in data writing operation. However, it may be adapted to be activated only in reading operation in view of consumption of electric power for example. In such a case, the device may have a construction including an MOS transistor which is provided between the node N3 and the ground for example and is turned off in response to the write instruction signal W. Needless to say, the device is not limited to that construction and other construction may be adopted.

In the above described embodiment, the transistors Q14 and Q15 of the current mirror type amplifier 30 are connected to the power supply potential Vcc and the transistors Q18 and Q19 are connected to the ground potential. However, the level of the power supply potential is not limited thereto and the polarities of the transistors of the amplifier 30 are not limited thereto. If the polarities of the transistors are reversed or the level of the power supply potential is reversed, the same effects as in the above described embodiment can be obtained. In such case, a relation between the polarities of the signal potentials on the bit lines BL and $\overline{BL}$ and the polarities of the signal potential applied to the read-out data transferring buses IL and $\overline{IL}$ can be regulated but suitable selection of the level of the power supply potential and the polarities of the transistors.

Now, advantages of the current-mirror type differential sense amplifier of the present invention over a simple differential sense amplifier as used in the previously described prior art of Watanabe are discussed in detail, with reference to FIGS. 10A, 10B, 11A and 11B.

Watanabe employs a BiCMOS differential sense amplifier taking advance of high drivability (or current carrying capability) and high sensitivity to small signals of a bipolar differential sense amplifier. However, a bipolar transistor has small input impedance, and therefore the input of the bipolar differential sense amplifier can not be directly connected to a bit line without exerting an adverse effect on a small signal voltage appearing on the bit line before activation of a conventional flip-flop type sense amplifier. Thus, the clocked inverter is provided between a bit line and an input of a BiCMOS differential sense amplifier in Watanabe prior art, resulting in the delay in signal transmission from a bit line to a BiCMOS sense amplifier and also larger area consumption degrading integration of the memory device.

On the other hand, CMOS transistors are employed for the differential sense amplifier for erasing data in the present invention. An MOS transistor has a gate oxide electrically insulating the gate electrode from the source and drain regions. Thus, when the gate electrode of an MOS transistor is employed as and input gate, the MOS transistor provides a high input impedance. Therefore, means for providing a high input impedance are not required at all in the present invention, because the CMOS differential sense amplifier inherently provides a high input impedance. Thus, the disadvantages of the prior art can be eliminated.

Furthermore, the current-mirror type sense amplifier of the present invention has a kind of positive feed-back by mirroring the current between the two inverters. So, the amplifying speed can be improved over the simple differential sense amplifier.

Figure 10A:
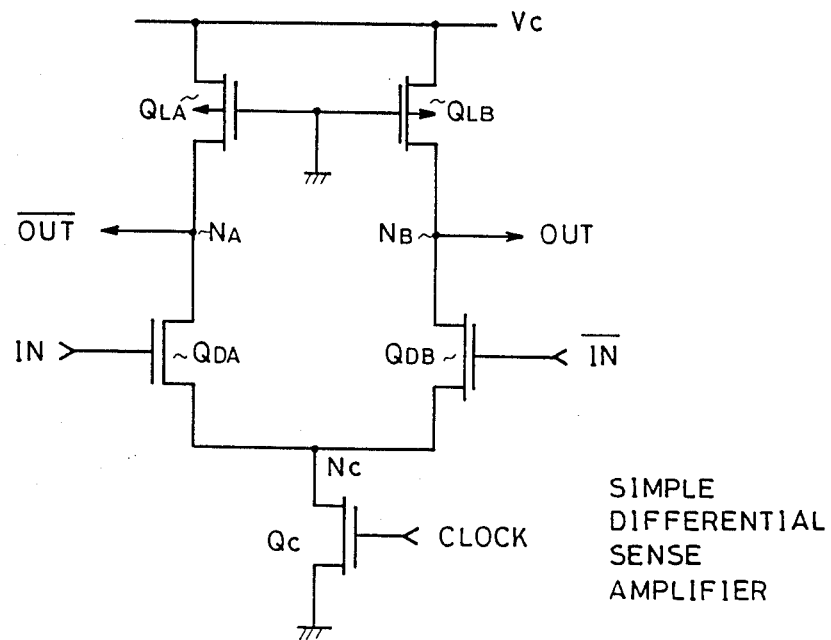
FIG. 10A shows a circuit diagram of a simple differential sense amplifier.
Figure 10B:
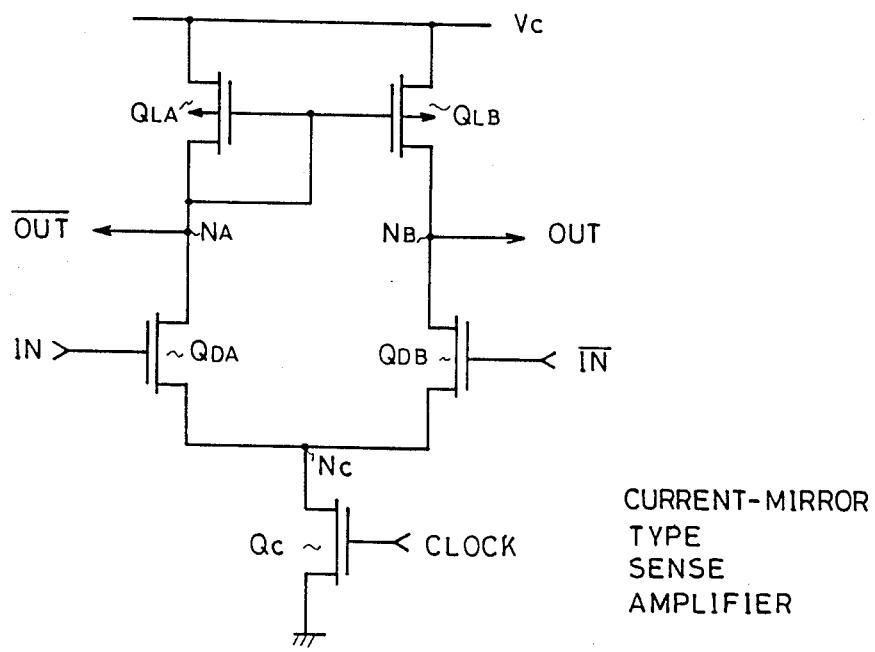
FIG. 10B shows a circuit diagram of a current-mirror type differential sense amplifier.

FIG. 10A shows a circuit diagram of a conventional simple differential sense amplifier, and FIG. 10B shows a circuit diagram of the current mirror type differential sense amplifier. For easier comparison, both amplifiers are shown consisting of MOS transistors instead of BiCMOS transistors.

The simple differential sense amplifier comprises two inverters and an actuation transistor Qc provided between the two inverters and ground potential. One inverter consists of an N channel driver MOS transistor $Q_{DA}$ and a P channel load MOS transistor $Q_{LA}$. The other inverter consists of an N channel driver transistor $Q_{DB}$ and a P channel load MOS transistor $Q_{LB}$. The nodes $N_A$ and $N_B$ are output nodes to provide data output $\overline{OUT}$, OUT, respectively. The operation of the simple differential sense amplifier is described.

When the signal CLOCK goes high, the activation transistor Qc is turned on to pull the node Nc down to activate the two inverters $Q_{LA}/Q_{DA}$ and $Q_{LB}/Q_{DB}$. The output nodes $N_A$ and $N_B$, precharged to a high level through the on-state transistors $Q_{LA}$ and $Q_{LB}$, change their levels from the high level to a certain level according to the different impedances of the driven transistors $Q_{DA}$ and $Q_{DB}$ depending on the received differential input signals IN and $\overline{IN}$. Then, the output signals OUT and $\overline{OUT}$ are developed independently, and the voltage difference between the outputs OUT and $\overline{OUT}$ is caused only by the voltage difference between the input IN and $\overline{IN}$ and is not so large. Therefore, in Watanabe, the level shift circuit and another differential sense amplifier is provided in order to amplify the insufficient voltage difference between the outputs OUT and $\overline{OUT}$.

FIG. 10B shown the circuit diagram of the current-mirror type sense amplifier. The sense amplifier of FIG. 10B consists of the same transistors as those of FIG. 10A, but the gates of the active load transistors $Q_{LA}$ and QLB are connected to the output node $N_A$ instead of the ground terminal. In this configuration, the level of the output node $N_B$ is controlled by the level of the node $N_A$. For example, when the input IN is higher in the level than the input $\overline{IN}$, the transistor $Q_{DA}$ becomes more conductive than the transistor $Q_{DB}$ to pull the node $N_A$ down to a lower level, which makes the load transistor $Q_{LB}$ more conductive. Thus, the output node $N_B$ is pulled up more quickly than the amplifier shown in FIG. 10A. This operation is a kind of positive feedback between the two outputs OUT and $\overline{OUT}$.

Figure 11A:
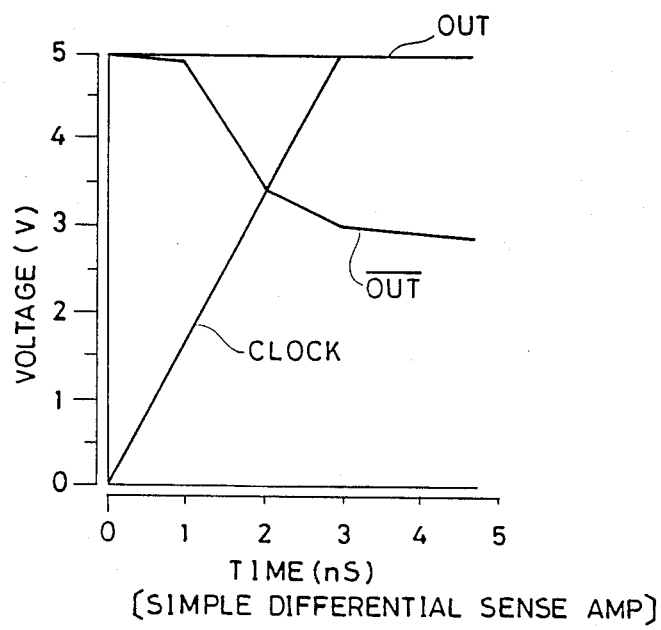
FIG. 11A represents an operating characteristics of the simple differential sense amplifier; obtained by a circuit simulation.
Figure 11B:
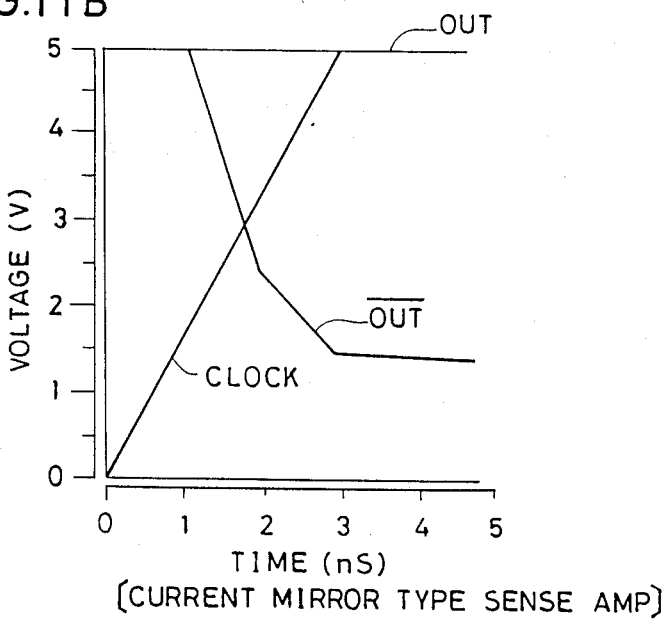
FIG. 11B represents an operating characteristics of the current-mirror type differential sense amplifier.

FIG. 11A and 11B represent an example of operating characteristics of the outputs of respective amplifiers, obtained by a circuit simulation using the same circuit parameters. FIG. 11A demonstrates the output characteristics of the simple differential sense amplifier, and FIG. 11B demonstrates the output characteristics of the current-mirror type differential sense amplifier.

As clearly shown from these figures, a current-mirror type differential sense amplifier is more advantageous over the simple differential sense amplifier in speeding the operation, because the current-mirror type amplifier provides a larger differential signal voltage than the simple sense amplifier with respect to a given time after activation of the amplifiers.

Figure 1:
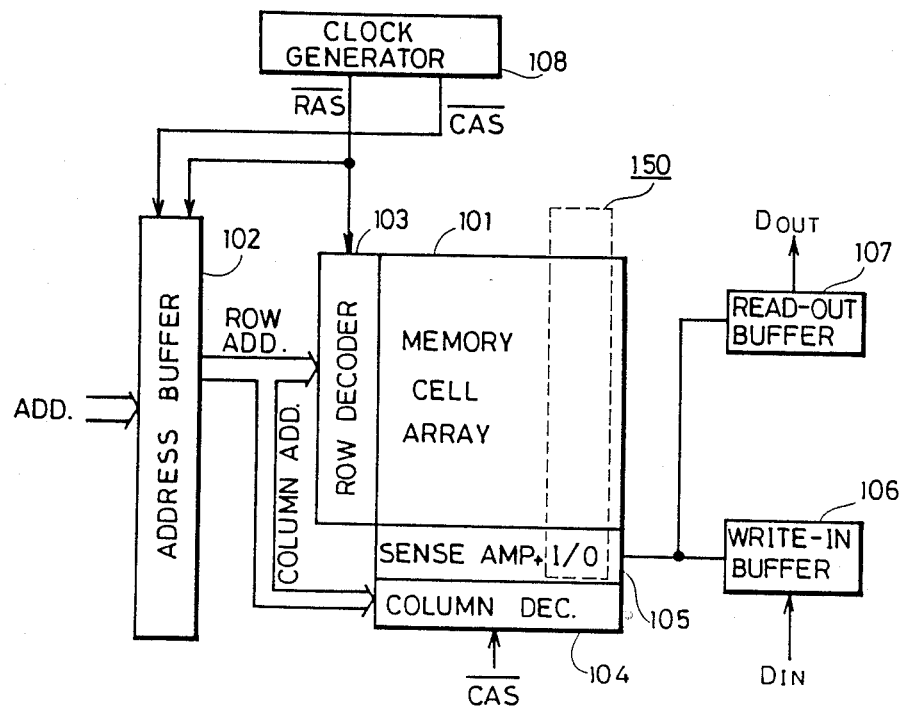
FIG. 1 shows a schematic entire configuration of a conventional semiconductor memory device.
Figure 2:
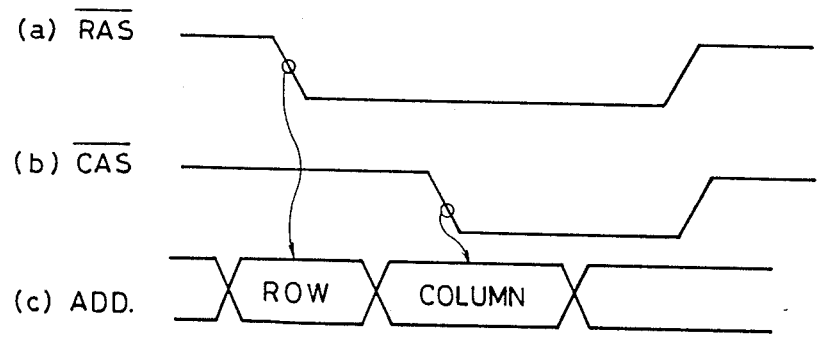
FIGS. 2a-c waveform diagram representing an address strobe timing.
Figure 3:
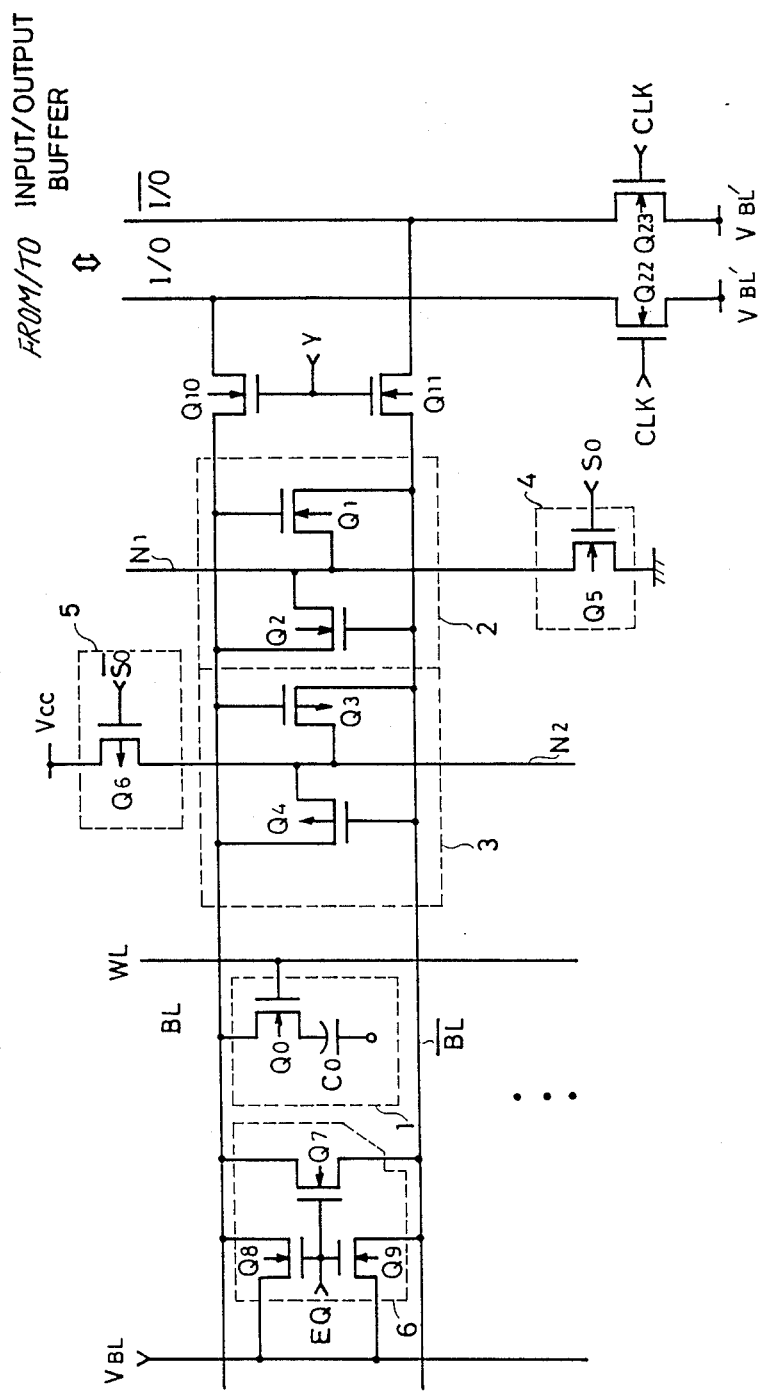
FIG. 3 is a diagram showing a configuration of a main part of the array portion of FIG. 1.
Figure 4:
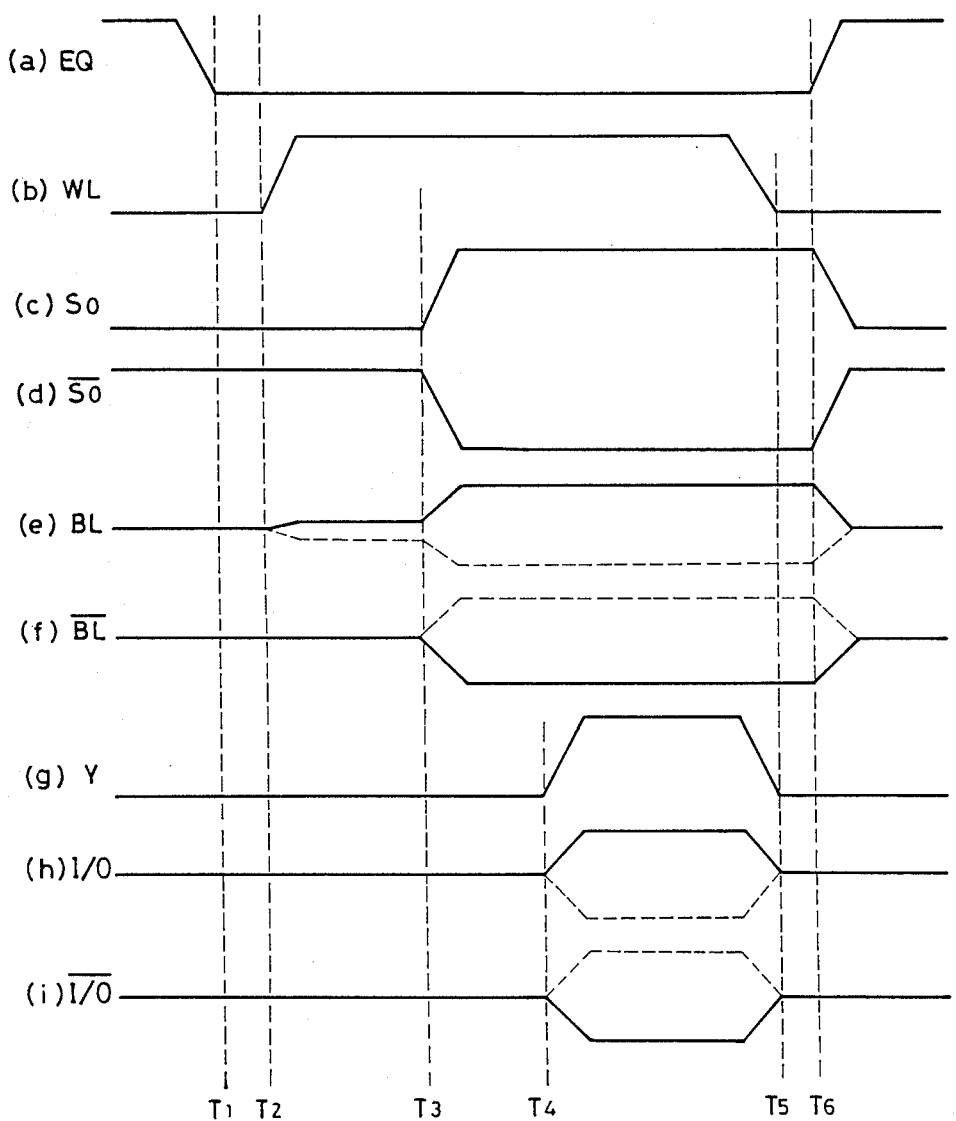
FIGS. 4a-d are the waveform diagrams showing a reading operation of memory device.
Figure 5:
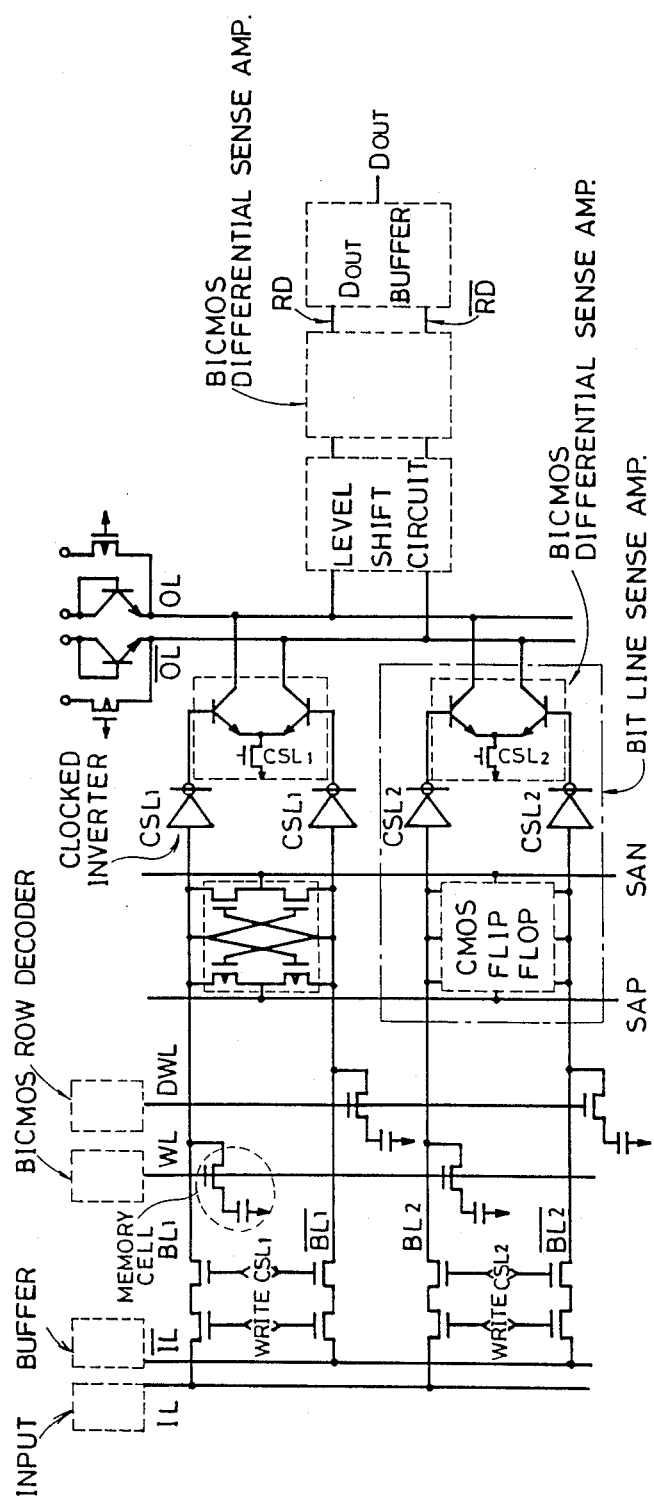
FIG. 5 is a circuit diagram of a main part of another conventional DRAM in which a write-data bus and a read-data bus are separately provided.
Figure 6:
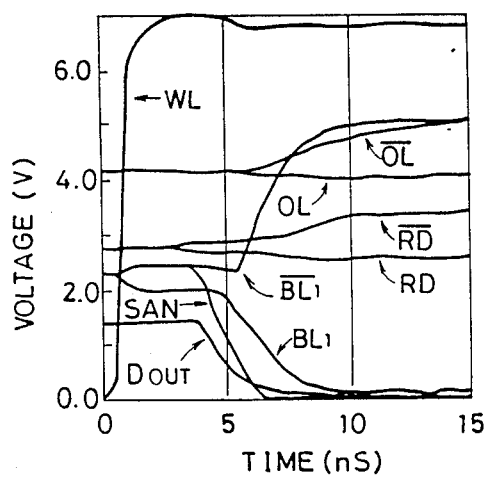
FIG. 6 is a waveform diagram of the main nodes of the DRAM as shown in FIG. 5 at a read operation.
Figure 7:
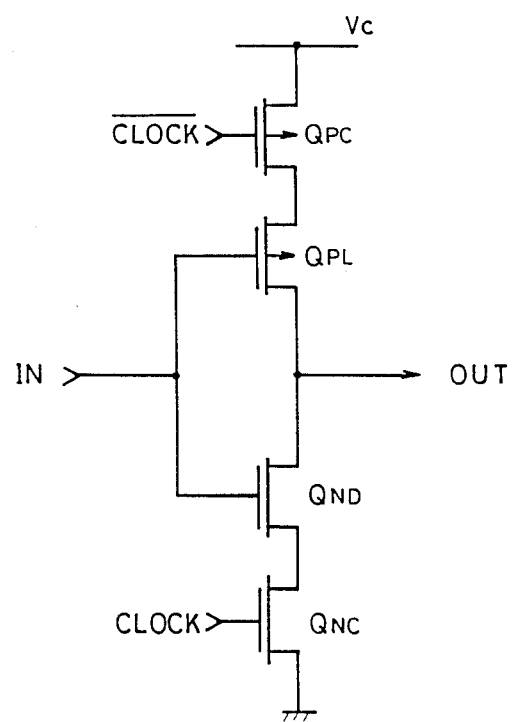
FIG. 7 is a circuit diagram of a typical clocked inverter the DRAM as shown in FIG. 5.
Figure 12:
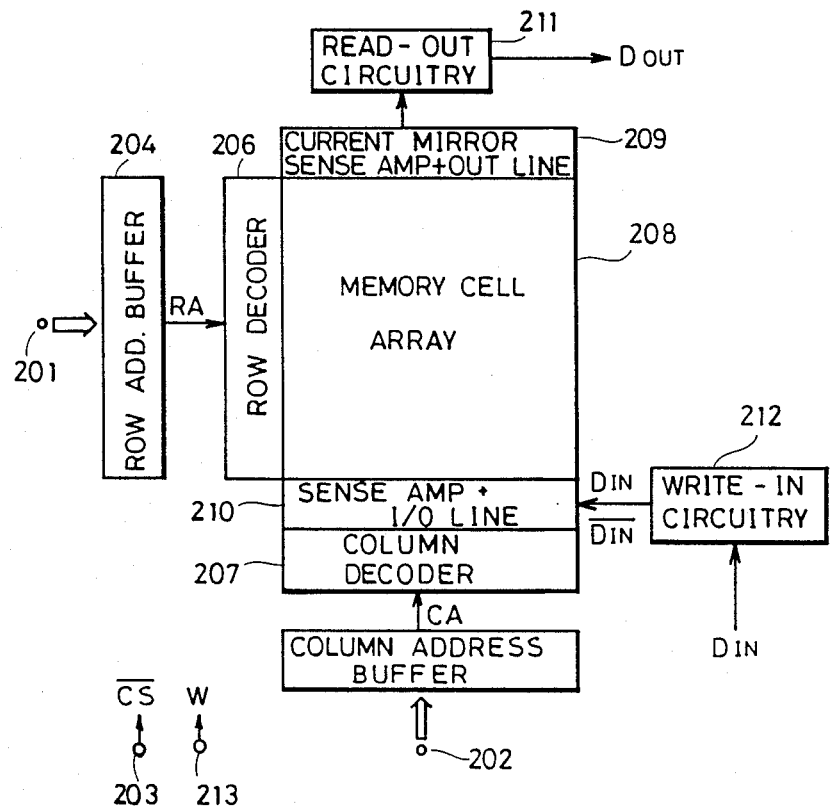
FIG. 12 shows an entire structure of the semiconductor memory device according to the present invention.
Figure 13:
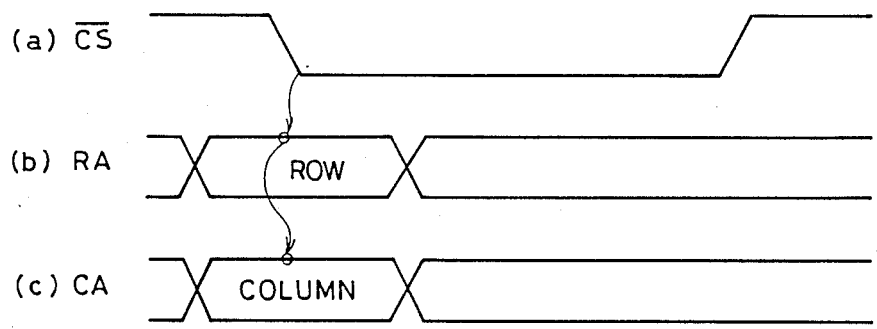
FIG. 13a–c are the waveform diagram representing timing for strobing address signals in the memory device of FIG. 7.

If information is to be read out immediately after the rise of the word lines WL, it is necessary to change the level of the column decoder output signal Y to the high level as fast as possible. This can be achieved by regulation using the write instruction signal and the column address strobe signal. If reading operation can be performed immediately after the rise of the word line as described above, it is desired that a difference in time between input of a row address for selection of a word line and input of a column address for selection of a pair of bit lines be as little as possible. However, the conventional dynamic semiconductor memory device has a construction, as shown in FIG. 1, in which a row address and a column address are applied to the same address input terminal in a time division manner. More specifically, in the construction of the conventional device, a row address is applied first to address input terminals and then a column address is applied thereto. The row address is accepted by an address buffer at the fall of the row address strobe signal $\overline{RAS}$ so as to be applied to the row decoder, while the column address is accepted by the address buffer at the fall of the column address strobe signal $\overline{CAS}$ so as to be applied to the column decoder. Accordingly, the conventional device having the construction for inputting the row address and the column address in the time division manner as described above is considered to involve a problem that the difference in time between the input of the row address and the input of the column address cannot be reduced to a desired limit value, imposing a limitation on high-speed reading operation. In order to reduce the difference in time between the input of the row address and the input of the column address, a construction as shown in FIG. 12 is adopted in which row address input terminals for receiving a row address and column address input terminals for receiving a column address are provided separately. This construction makes it possible to set timing for receiving a row address and that for receiving a column address simultaneously and to perform reading operation at higher speed.

Referring now to FIG. 12, the whole construction of the semiconductor memory device of this embodiment will be described. A row address input 201 and a column address input 202 are provided separately and a row address and a column address are supplied to a row address buffer 204 and a column address 205, respectively, through the respective terminals. Timing for accepting address signals of the row address buffer 204 and the column address buffer 205 is applied by a chip select signal $\overline{CS}$ supplied through a terminal 203, and an internal row address RA and an internal column address CA are applied to the row decoder 206 and the column decoder 207, respectively. The row decoder 206 selects a word line out of the memory cell array 208. The column decoder 207 generates the bit line pair selection signal Y and applies it to a block 209 (including the current mirror type amplifier and the output line) and a block 210 (including the sense amplifier and the input line). Data read out by the block 209 is outputted as output data $D_{OUT}$ through a read-out circuit 211. On the other hand, in writing operation, a selected bit line pair is connected to a write-in circuit 212 through the block 210 and write-in data $D_{IN}$ is written in a selected memory cell. The write instruction signal W is applied through the terminal 213. The above described construction shown in FIG. 12 makes it possible to accept a row address and a column address simultaneously at the fall of the chip select signal $\overline{CS}$ as a strobe signal and to apply the row address and the column address to the row decoder and the column decoder, respectively. Thus, reading operation can be performed at higher speed by earlier activation of the current mirror type amplifier.

Figure 14:
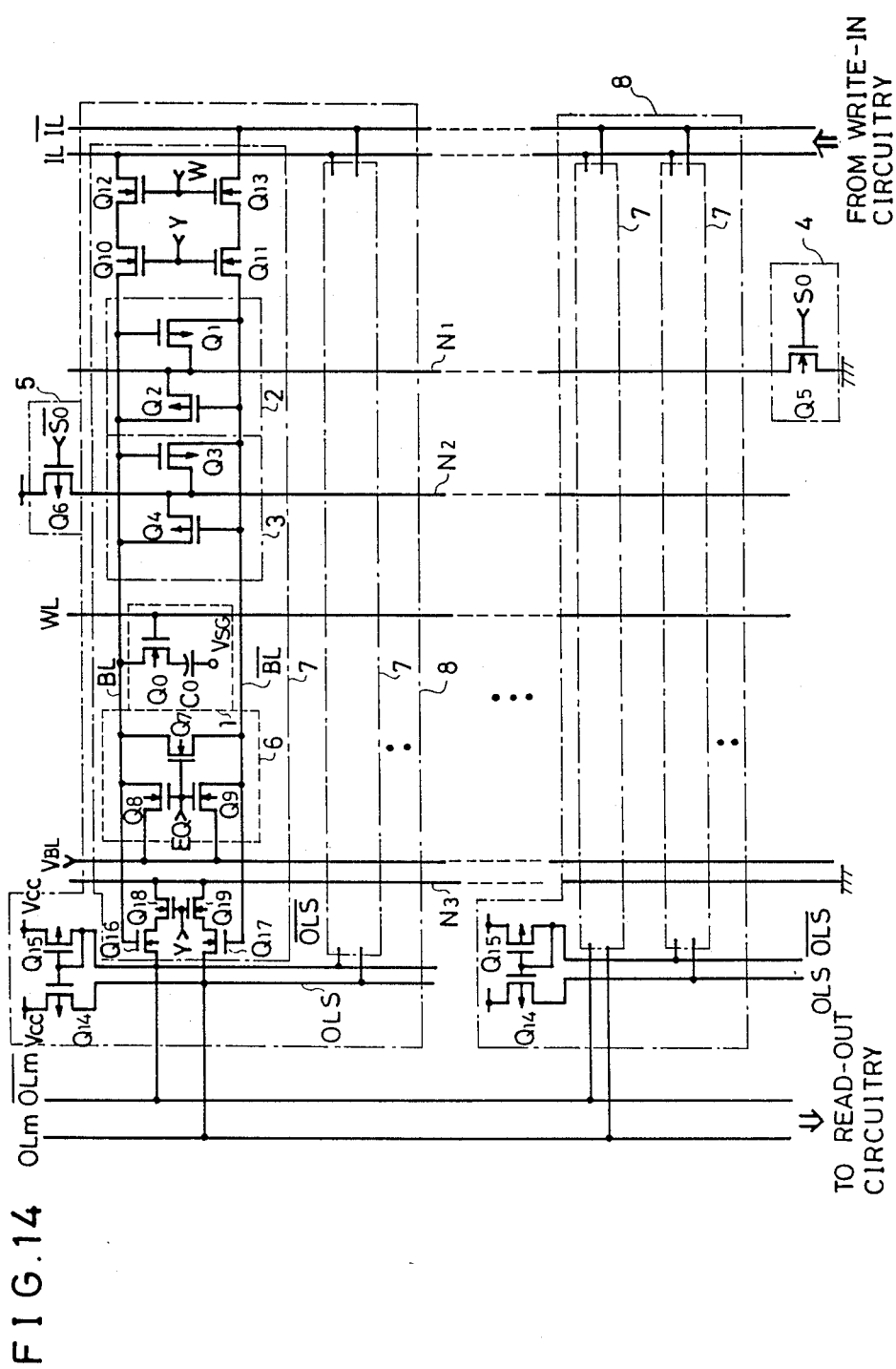
FIG. 14 is a diagram showing a construction of still another embodiment of the present invention.

In the above described embodiments, the pair of read-out data transferring bus lines of the output portion of each current mirror type sense amplifier are provided in common for all the bit line pairs, that is, in common for all the current mirror type sense amplifiers. In this case, the capacitance of the pair of read-out data transferring bus lines OL and $\overline{OL}$ might degrade such characteristics as high-speed amplifying operation. The load capacitance of the output portion of the current mirror type sense amplifier is preferably as small as possible in view of high-speed and reliable operation of amplification. FIG. 14 is a diagram showing a construction of another embodiment of the present invention, in which load capacitance of an output portion of a current mirror type sense amplifier is decreased and drive capability for the output portion is enhanced.

Referring to FIG. 14, a pair of read-out data transferring buses comprises a pair of sub lines OLs and $\overline{OLs}$ for reading of data and a pair of main lines $\overline{OLm}$ and $\overline{OLm}$ for reading of data. In this construction, data is written by the data write-in circuit through the write-in data transferring buses IL and $\overline{IL}$ and the MOS transistors Q12 and Q13, while data is read out through the sub lines OLs and $\overline{OLs}$ and the main lines OLm and $\overline{OLm}$ for reading of data.

Construction of a path for writing data is the same as shown in FIG. 8. More specifically, transistors Q12 and Q13 which are turned on only at writing operation are provided between the transistors Q10 and Q11 to be turned on in response to the column decoder output Y and the pair of write-in data transferring buses IL and $\overline{IL}$.

A path for reading data comprises a current mirror type amplifier for detecting and amplifying a signal potential on the pair of the bit lines BL and $\overline{BL}$. This amplifier comprises transistors Q14 to Q19. The pair of the bit lines BL and $\overline{BL}$ are connected to the input gates thereof. The output nodes thereof constitute the pair of sub lines OLs and $\overline{OLs}$ for reading of data.

More specifically, the current mirror type amplifier comprises two inverters of transistor Q14, Q17 and Q15, Q16 and two activation transistors Q18 and Q19. P channel MOS transistor Q14 has one conduction terminal connected to the power supply potential Vcc for example and the other conduction terminal connected to the sub line $\overline{OLs}$. P channel MOS transistor Q15 has one conduction terminal connected to the power supply potential Vcc for example and the other conduction terminal connected to its gate and the gate of the transistor Q14 as well as to the sub line $\overline{OLs}$. N channel MOS transistor Q16 has one conduction terminal connected to the sub line $\overline{OLs}$ and a gate connected to the bit line BL. N channel MOS transistor Q17 has one conduction terminal connected to the sub line OLs and a gate connected to the bit line $\overline{BL}$. N channel MOS transistors Q18 and Q19 which are turned on in response to the bit line pair selection signal Y from the column decoder (not shown in FIG. 9) to connect both the other conduction terminals of the transistors Q16 and Q17 to the ground potential through the node N3 so that the amplifier is activated.

Since input impedance of the gates of the transistors Q16 and Q17 has a very large value, the signal potential difference on the pair of the bit lines is amplified and transferred to the output node, that is, the pair of sub lines OLs and $\overline{OLs}$ at high speed when the amplifier is lines OLs and $\overline{OLs}$ at high speed when the amplifier is activated, without causing any unfavorable influence to the signal potential difference on the bit lines BL and $\overline{BL}$.

In addition, as shown in FIG. 14, the pair of the sub lines OLs and $\overline{OLs}$ are connected to a predetermined number of bit line pairs 7 so as to constitute a block 8. In the memory cell array, a plurality of such blocks 8 are provided and outputs of the respective blocks 8 are transferred to the common pair of the main lines OLm and $\overline{OLm}$ for reading of data. Such arrangement makes it possible to decrease the load capacitance of the pair of the sub lines OLs and $\overline{OLs}$ of the output node of the current mirror type sense amplifier and to assure reliability and high speed of amplification operation.

Figure 15:
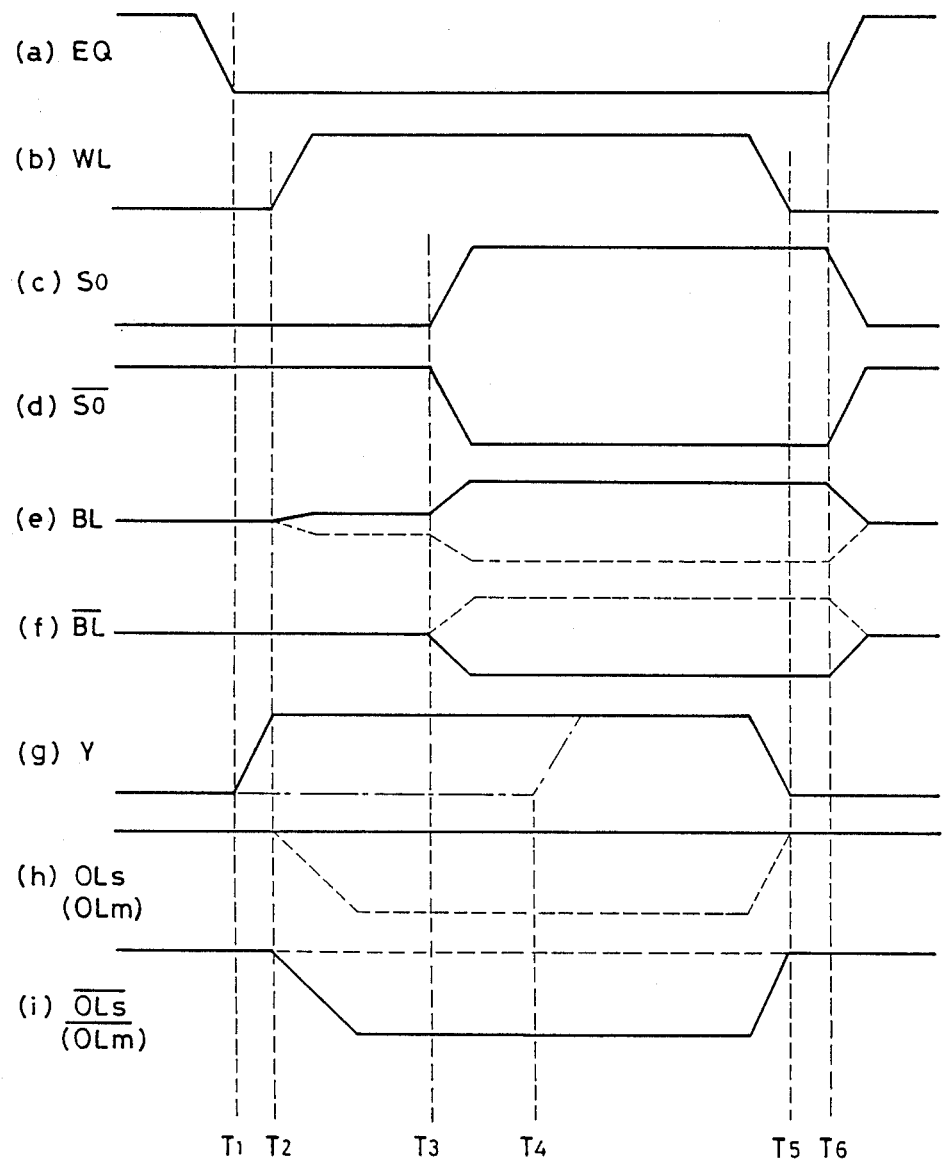
FIG. 15a–i are the signal waveform diagram showing operation of the semiconductor device of FIG. 14.

FIG. 15 is a signal waveform diagram showing operation of the semiconductor memory device of the above described embodiment, the same reference characters as in FIG. 14 representing signal potential changes in the corresponding portions. In the following, the operation of the semiconductor memory device of the above described embodiment will be described with reference to FIGS. 14 and 15.

First, reading operation will be described. At first, the write instruction signal W is at the low level and the pair of data buses for writing of data are isolated from the pair of bit lines. Since the equalizing signal EQ is at the high level before the time T1, the MOS transistors Q7 to Q9 are all in the on state and the bit lines BL and $\overline{BL}$ are precharged at the predetermined precharge potential $V_{BL}$. On the other hand, the pair of main data lines OLm and $\overline{OLm}$ for reading of data and the pair of sub data lines OLs and $\overline{OLs}$ for reading of data are precharged at the power supply potential Vcc for example.

When the equalizing signal EQ changes from the high level to the low level at the time T1, the transistors Q7 to Q9 of the equalizing/precharge circuit 6 are all turned off and as a result the bit lines BL and $\overline{BL}$ are both in the electrically floating state.

At the time T2, a word line WL is selected in response to an address signal externally applied and the potential of the word line WL changes from the low level to the high level. Then, the transistor Q0 of the memory cell 1 is turned on. If the memory cell 1 stores the information "1", the potential on the bit line BL slightly rises as shown by the solid lines in FIG. 10. In this case, when the bit line pair selection signal or column decode signal Y from the column decoder changes from the low level to the high level at the time T1 in response to the externally applied address signal, the transistors Q18 and Q19 are turned on and the current mirror type amplifier including the transistors Q14 to Q19 is activated. As a result, if the potential of the word line WL changes from the low level to the high level at the time T2 and the signal potential on the bit line BL slightly rises with the potential of the bit line $\overline{BL}$ being maintained at the precharge potential, the current mirror type amplifier immediately amplifies the potential difference and discharges the sub line $\overline{OLs}$ from the precharge potential to the ground potential. The signal potential appearing on the pair of sub lines OLs and $\overline{OLs}$ is transferred onto the pair of main lines OLm and $\overline{OLm}$. Thus, it becomes possible to read out data before activation of the sense amplifiers 2 and 3, and high-speed access can be attained. Since the pair of the bit lines BL and $\overline{BL}$ are connected to the pair of the sub lines $\overline{OLs}$ and $\overline{OLs}$ for reading of data through high impedance of the transistors Q16 and Q17, respectively, the load capacitance and the signal potential of the pair of the sub lines OLs and $\overline{OLs}$ do not exert any unfavorable influence on the signal potential on the pair of the bit lines BL and $\overline{BL}$. In addition, the pair of the sub lines OLs and $\overline{OLs}$ are provided in common for the predetermined number of bit line pair blocks 7 and accordingly the load capacitance thereof is small. Thus, an output signal according to the signal potential on the pair of the bit line BL and $\overline{BL}$ can be transferred to the output nodes OLs and $\overline{OLs}$ at high speed.

Thereafter, the sense amplifier activation signals S0 and $\overline{S0}$ are brought into the activated state at the time T3 and the transistors Q5 and Q6 are turned on, so that the sense amplifiers 2 and 3 are activated. As a result, the signal potential difference on the bit lines BL and $\overline{BL}$ is further amplified. The amplification operation by the sense amplifiers 2 and 3 is performed for restoring operation to rewrite read-out information into the memory cell 1.

When the potential of the selected word line WL and the column decoder output Y change from the high level to the low level at the time T5, the current mirror type amplifier is brought into the non-activated state and the potentials of the pair of sub lines OLs and $\overline{OLs}$ and the pair of main lines OLm and $\overline{OLm}$ return to the predetermined precharge potential.

When the sense amplifier activation signals S0 and $\overline{S0}$ are in the non-activated state and the equalizing signal EQ rises to the high level at the time T6, precharging and equalizing of the bit lines BL and $\overline{BL}$ are performed. Thus, a memory cycle is completed.

In the above described memory cycle, when the bit line pair selection signal Y from the column decoder rises to the high level at the time T2, the transfer gate transistors Q10 and Q11 are also turned on at the same time. However, since the write instruction signal W is at the low level at the time of reading data, the transistors Q12 and Q13 are in the off state and accordingly the pair of the write-in data transferring buses IL and $\overline{IL}$ do not exert any influence on the data reading operation.

In the above described embodiment, the case of the selected memory cell 1 having the information "1" was described. If the selected memory cell 1 has information "0", the signal waveform as shown by the broken lines in FIG. 15 is obtained.

In the above described embodiment, the precharge potential of the pairs of the data lines OLs and $\overline{OLs}$, OLm and $\overline{OLm}$ is set to the power supply potential level. However, the precharge potential of the pair of the main lines may be set to an internal potential, for example, $V_{BL}'$ as in the conventional device, not to the power supply potential level. In such case, if a transfer gate to be turned on and off in response to a block selection signal (which can be easily formed by a column address) is provided between the pair of main data lines and the pair of sub data lines, the precharge potential of each pair can be maintained and the load capacitance of the output portion of the current mirror type sense amplifier can be produced only from the pair of the sub data lines.

In addition, since in the above described construction, a plurality of blocks 7 each including a bit line pair and a part of a current mirror amplifier are connected in parallel with a pair of sub data lines OLs and $\overline{OLs}$ and accordingly the plurality of N channel MOS transistors Q16 and Q17 are connected in parallel with the pair of sub data lines OLs and $\overline{OLs}$. Thus, a large number of gate capacitances are connected to cause increase in the load capacitance of the current mirror type amplifiers. However, since each pair of sub lines for reading of data is connected with only a predetermined number of bit line pair blocks 7 and each pair of sub lines includes a current mirror type amplifier, load capacitance for one pair of sub lines for reading of data can be decreased and high-speed operation can be performed. In this case, if a transfer gate to be turned on and off in response to a block selection signal is provided between a pair of main data lines and a pair of sub data lines and each pair of data lines is independently precharged, only the pair of sub data lines has load capacitance at the time of amplification, and thus, high-speed reading operation can be effectively performed.

In the following, an outline of data writing operation will be described. Externally supplied data to be written are transferred in a complementary form (for example, as $D_{IN}$ and $\overline{D_{IN}}$) from a data write-in circuit (not clearly shown in the drawing) to the pair of write-in data transferring buses IL and $\overline{IL}$. In writing operation, the write instruction signal W is at the high level and accordingly the transistors Q12 and Q13 are in the one state. Consequently, a pair of bit lines selected by the column decoder output Y is connected to the pair of write-in data transferring buses IL and $\overline{IL}$ at the time T4, whereby data is enable to be written in the selected memory cell. According to the waveform diagram of FIG. 10, it is indicated that the column decoder output Y changes to the high level at the time T4 in writing operation. Such shifting to the activated state of the column decoder output Y in writing operation and in reading operation can be easily attained based on the write instruction signal W and the column address strobe signal $\overline{CAS}$, or the sense amplifier activation signal So or the like.

Although in the above described embodiment, the column decoder output Y in reading operation changes to the high level simultaneously with the change of the equalizing signal EQ to the low level, the change of the column decoder output Y to the high level is not limited to the operation timing shown in FIG. 15 and the column decoder output may change to the high level simultaneously with the change of the word line WL to the high level as described previously with reference to FIG. 12. In any case, the change of the column decoder output Y to the high level for applying activation timing for the current mirror type amplifier is an operation parameter determined suitably taking account of operation characteristics or the like of a practically utilized semiconductor memory device.

In the operational waveform diagram shown in FIG. 15, the column decoder output Y changes, at the time T4, to the activated state that is, the high level as shown by the chained lines in FIG. 15. However, the time for change to the high level is not limited to the time T4. If the change to the high level is made at the time T2, writing operation can be reliably performed.

In addition, although in the above described embodiment the current mirror type amplifier has the transistors Q14 and Q15 connected to the power supply potential Vcc and the transistors Q18 and Q19 connected to the ground potential, the power supply potential and the polarities of the respective transistors are not limited to the construction shown in the drawing. Those can be suitably selected according to a construction of a semiconductor memory device to which the present invention is applied. Further, in the above described construction, the current mirror type amplifier is also activated at writing operation. However, the current mirror type amplifier may be activated only at reading operation in view of consumption of electric power. Activation in this manner can be easily accomplished if an AND gate for receiving the write instruction signal W and the column decoder signal Y is provided.

Figure 16:
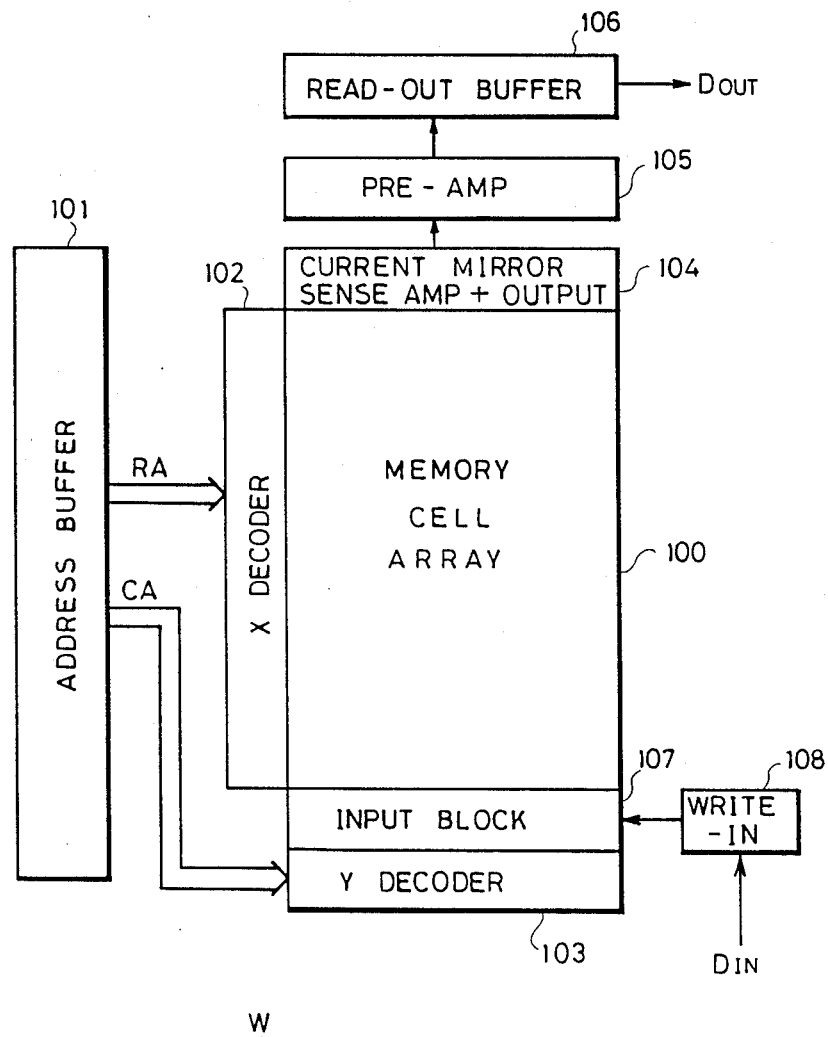
FIG. 16 is a schematic view showing entire construction of the semiconductor memory device as shown in FIG. 14.

FIG. 16 is a schematic view showing an entire construction of the semiconductor memory device as shown in FIG. 14. Referring to FIG. 16, the semiconductor memory device of the present invention includes a memory cell array 100 having a folded bit line structure. An X decoder 102 for decoding an internal row address signal from an address buffer 101 for receiving an externally applied address is provided to select memory cells of one row from the memory cell array (that is, to select a word line). A Y decoder (i.e., a column decoder) 103 for outputting the bit line pair selection signal Y is provided for selection of a pair of bit lines in response to an internal column address signal from the address buffer 101. A block 104 including pairs of sub data lines for reading provided for each bit line pair block formed by a predetermined number of bit line pairs, a pair of main data lines for reading provided in common for each pair of sub data lines, and current mirror type amplifiers provided for each bit line pair is provided for fast reading operation. A preamplifier 105 for further amplifying read-out data from the block 104, a read-out buffer 106 for outputting read-out information from the preamplifier 105 to an external terminal are provided for reading data. A write-in buffer 108 for generating internal write-in data out of the write-in data $D_{IN}$ and transferring the same to a pair of data input lines IL and $\overline{IL}$ included in an input block 107 is provided for writing data. The write instruction signal W is applied to the related circuit portions through the terminal 109. This construction is shown only by way of example. Needless to say, other construction is also applicable.

As described above, according to the present invention, the semiconductor memory device comprises pairs of write-in data transferring buses, pairs of read-out data transferring buses and current mirror type amplifiers between the respective bit lines and the respective pairs of read-out data transferring buses. Each current mirror type amplifier is activated by an output of a column decoder and it has an output node formed by the pair of read-out data transferring buses, with an input gate thereof being connected to the corresponding pair of bit lines. Accordingly, even immediately after the rise of the potential on the selected word line, no unfavorable influence is exerted on the potential for read-out on the pair of bit lines and data reading operation can be performed at high speed. Thus, access time in reading operation can be remarkably reduced and high-speed operation for reading can be attained.

In addition, in a construction in which a row address and a column address are supplied through different paths, decoding of the row address and decoding of the column address can be performed substantially at the same time and the current mirror type sense amplifier can be activated immediately after the rise of the potential of the selected word line. Thus, data can be read out at higher speed.

Furthermore, if a pair of read-out data transferring buses comprises a plurality of pairs of sub data transferring buses each provided in common for a predetermined number of bit line pairs to form output nodes of current mirror sense amplifiers, and comprises a pair of main data transferring buses provided in common for all the pairs of sub data transferring buses to receive a signal on each pair of sub data transferring buses, load capacitance of an output portion of each current mirror sense amplifier can be reduced and reading operation can be performed at higher speed and with higher reliability.

Still further, the CMOS current-mirror type differential sense amplifier has a high input impedance so that no additional high input impedance means for isolating electrically the bit lines from the output lines are not required, which is advantageous in area consumption for implementing a high density memory device.

Still furthermore, the current-mirror sense amplifier has a positive feed-back so that a larger differential signals is provided at the output nodes to be advantageous in fast reading operation.

In the above description, MOS type components are employed. However, in general the term "MOS" may be substituted by the term "MIS" (metal-insulator-semiconductor), and therefore MIS type components may be employed in place of MOS type components in the above embodiments to obtain the same effect.

In addition, in the above examples, the signals are made inactive at the time T5 or T6. For example, the signals WL and Y are inactivated or transit to the low level at the time T5. However, the inactivating timing is not limited thereto, and any different timing deviated from the times may be employed.

Regarding other timings, the inactivating timing is not a essential matter of the invention, the inactivating timing may be differentiated, as necessary.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a memory cell array of a plurality of memory cells arranged in rows and in columns, a plurality of word lines for selecting a row out of said memory cell array, and a plurality of pairs of bit lines for selecting a column out of said memory cell array, comprising:
    row address input means for receiving an externally applied row address,
    row selection means for selecting a row out of said memory cell array in response to the row address from said row address input means,
    column address input means for receiving an externally applied column address,
    column selection means for selecting a bit line pair for selecting a column out of said memory cell array in response to the column address from said column address input means,
    a pair of write-in data transferring bus lines connected to a bit line pair designated by said column address in response to an output of said column selection means in writing operation, for transferring data to be written in a memory cell selected by said row address and said column address,
    a pair of read-out transferring bus lines provided separately from said pair of write-in data transferring buses, for transferring data on the bit line pair selected by said column address in reading operation, and
    amplifier means corresponding to each bit line pair and responsive to the output of said column selection means for driving said read-out data transferring bus lines in accordance with data on said selected bit line pair, said amplifier means comprising
    (a) means for directly receiving and detecting a voltage difference of said selected bit line pair;
    (b) first and second voltage amplification means for amplifying respectively, voltages on the bit lines of said selected bit line pair;
    (c) means for establishing a positive feedback signal flow path between said first and second voltage amplification means, to increase a rate of voltage change of said first and second voltage amplification means;
    (d) means responsive to said first and second voltage amplification means for controlling first and second currents;
    (e) means for converting said first and second currents to a voltage difference;
    (f) means for applying said voltage difference to said read-out data transferring bus lines;
    flip-flop type sense amplifiers provided for the respective bit line pairs, for differentially amplifying a potential difference on the corresponding bit line pair, and
    means for activating said amplifier means before the corresponding one of said flip-flop type sense amplifiers is activated.

2. A semiconductor memory device in accordance with claim 1, wherein
    a single address input means is used in common as said row address input means and said column address input means, and said externally applied row address and column address are applied to said single address input means in a time-division manner.

3. A semiconductor memory device in accordance with claim 1, wherein
    said row address input means and said column address input means are provided separately, and said row selection means and said column selection means are activated in response to the same control signal.

4. A semiconductor memory device in accordance with claim 1, wherein
    said amplifier means comprises first, second, third and fourth MOS transistors of a first conductivity type, and first and second MOS transistors of a second conductivity type;
    a drain of the first MOS transistor of the second conductivity type is connected to a first power supply, and a gate and a source thereof are connected to a first output node;
    a drain of the second MOS transistor of the first conductivity type is connected to said first output node, a gate thereof is connected to a bit line of the corresponding pair and a source thereof is connected to a first internal node;
    a drain of the second MOS transistor of the first conductivity type is connected to said second output node, a gate thereof is connected to the other bit line of said corresponding pair and a source thereof is connected to a second internal node;
    a drain of the third MOS transistor of the first conductivity type is connected to said first internal node, a gate thereof is connected to an output signal of said column selection means and a source thereof is connected to a second power supply; and
    a drain of the fourth MOS transistor of the first conductivity type is connected to said second internal node, a gate thereof is connected to the output signal of said column selection means and a source thereof is connected to said second power supply.

5. A semiconductor memory device having a memory cell array of a plurality of memory cells arranged in rows and in columns, a plurality of word lines for selecting a row out of said memory cell array, and a plurality of pairs of bit lines for selecting a column out of said memory cell array, comprising:

row address input means for receiving an externally applied row address, row selection means for selecting a row out of said memory cell array in response tot he row address from said row address input means, column address input means for receiving an externally applied column address, column selection means for selecting a bit lien pair for selecting a column out of said memory cell array in response to the column out of said memory cell array in response to the column address from said column address input means, a pair of write-in data transferring bus lines connected to a bit line pair designated by said column address in response to an output of said column selection means in writing operation, for transferring data to be written in a memory cell selected by said row address and said column address, a pair of read-out data transferring bus lines provided separately from said pair of write-in data transferring buses, for transferring data on the bit line pair selected by said column address in reading operation, and amplifier means corresponding to each bit line pair and responsive to the output of said column selection means for driving said read-out data transferring bus lines in accordance with data on said selected bit line pair, said amplifier means comprising
  (a) means for directly receiving and detecting a voltage difference of said selected bit line pair;
  (b) first and second voltage amplification means for amplifying respectively, voltages on the bit lines of said selected bit line pair;
  (c) means for establishing a positive feedback signal flow path between said first and second voltage amplification means, to increase a rate of voltage change of said first and second voltage amplification means;
  (d) means responsive to said first and second voltage amplification means for controlling first and second currents;
  (e) means for converting said first and second currents to a voltage difference; and
  (f) means for applying said voltage difference to said read-out data transferring bus lines, wherein;

said pair of read-out data transferring bus lines comprises:

a plurality of pairs of sub read-out data transferring bus lines, each pair being provided in common for a predetermined number of bit line pairs, and constituting output nodes of the amplifier means provided for each of said predetermined number of bit line pairs, and a pair of main read-out data transferring bus lines connected to all of said plurality of pairs of sub read-out data transferring buses, for receiving a signal on the pair of the sub read-out transferring bus lines constituting the output nodes of the amplifier means which are activated.

6. An accessing method in a random access memory device, wherein said memory device comprises a plurality of word lines, a plurality of bit lines, a plurality of memory cells each provided at an intersection of a word line and a bit line, a plurality of flip-flop type sense amplifiers each provided for each bit line pair to amplify a differential signal on the corresponding bit line pair, a first pair of data bus lines for transferring data to be written, a second pair of data bus lines separate from said first pair, the transferring data to be read, and a plurality of current mirror type amplifier means each provided between said second pair of data buses and each bit line pair, each of the amplifier means having input nodes connected to the corresponding bit line pair and said second pair of data buses forming output nodes thereof, said accessing method comprising the steps:

selecting a word line in accordance with a received row address to activate the selected word line;

selecting a bit line pair in response to an externally applied column address; amplifying a differential signal on said bit line pair to transfer the amplified signal to said second pair of data buses without influence on the signal levels on the corresponding bit line pair; and activating a corresponding flip-flop type sense amplifier, after activation of the current mirror type sense amplifier, to amplify a differential signal on said bit line pair;

said step of amplifying including the steps of;
  (a) applying a voltage difference of the bit line pair selected in accordance with the externally applied column address to said amplifier;
  (b) amplifying, respectively, voltages on the bit lines of said selected bit line pair;
  (c) feeding back amplified voltages of said bit lines along a positive feedback signal flow path to increase a rate of voltage change of said amplified voltages;
  (d) controlling first and second currents in response to voltages amplified in accordance with step (b);
  (e) converting said first and second currents to a voltage difference; and
  (f) applying said voltage difference to said read-out data transferring bus.

7. A semiconductor memory device having a memory cell array of a plurality of memory cells arranged in rows and in columns, a plurality of word lines for selecting a row out of said memory cell array, and a plurality of bit lines for selecting a column out of said memory cell array, comprising:

row address input means for receiving an externally applied row address, row selection means for selecting a row out of said memory cell array in response to the row address from said row address input means, column address input means for receiving an externally applied column address, column selection means for selecting a bit line pair for selecting a column out of said memory cell array in response to the column address from said column address input means, a pair of write-in data transferring bus lines connected to a bit line pair designated by said column address in response to an output of said column selection means in writing operation, for transferring data to be written in a memory cell selected by said row address and said column address, a pair of read-out data transferring bus lines provided separately from said pair of write-in data transferring buses, for transferring data on the bit line pair selected by said column address in reading operation, a plurality of current-mirror type sense amplifiers comprised of complementary metal insulated gate type transistors, each connected directly to a corresponding bit lien pair, and responsive to the output of said column selection means for detecting and amplifying a voltage difference on the selected bit line pair to transfer the amplified voltage difference to said read-out data transferring bus lines; and flip-flop type sense amplifiers provided for the respective bit line pairs, for differentially amplifying a potential difference on the corresponding bit line pair, wherein said amplifier means is activated before the corresponding one of said flip-flop type sense amplifiers is activated.

8. An accessing method in a random access semiconductor memory device, wherein said semiconductor memory device comprises a memory cell array of a plurality of memory cells arranged in rows and in columns, a plurality of memory cells arranged in rows and in columns, a plurality of word lines for selecting a row out of said memory cell array, a plurality of bit line pairs for selecting a column out of said memory cell array, a flip-flop type sense amplifier provided for each of the respective bit line pairs for differentially amplifying a potential difference on a corresponding bit line pair, a plurality of current-mirror type sense amplifiers each connected to a corresponding bit line pair and comprised of complementary metal insulated gate type transistors, and separate pairs of write-in data transferring bus lines and read-out data transferring bus lines, said accessing method comprising the steps of:

applying a row address to the device, selecting a row out of said memory cell array in response to the applied row address, applying a column address to the device, selecting a bit line pair in response to said column address;

transferring data to be written in a memory cell corresponding to said row address and said column address in a writing operation to a pair of write-in data transferring bus lines, and transferring data on a bit line pair corresponding to said column address in a reading operation to a pair of read-out data transferring bus lines, wherein said step of transferring data in a reading operation further comprises:

activating one of said plurality of current-mirror type sense amplifiers in response to the application of said column address including the steps of detecting and amplifying a voltage difference on the selected bit line pair, and activating a flip-flop sense amplifier corresponding to the selected bit line pair subsequent to said step of activating said current-mirror type sense amplifier.

9. A semiconductor memory device having a memory cell array of a plurality of memory cells arranged in rows and in columns, a plurality of word lines for selecting a row out of said memory cell array, and a plurality of pairs of bit lines for selecting a column out of said memory cell array, comprising:

row address input means for receiving an externally applied row address, row selection means for selecting a row out of said memory cell array in response to the row address from said row address input means, column address input means for receiving an externally applied column address, column selection means for selecting a bit line pair for selecting a column out of said memory cell array in response to the column address from said column address input means, a pair of write-in data transferring bus lines connected to a bit line pair designated by said column address in response to an output of said column selection means in writing operation, for transferring data to be written in a memory cell selected by said row address and said column address, a pair of read-out data transferring bus lines provided separately from said pair of write-in data transferring buses, for transferring data on the bit line pair selected by said column address in reading operation, current-mirror amplifier means corresponding to each bit line pair and responsive to the output of said column selection means for driving said read-out data transferring bus lines in accordance with data on said selected bit line pair, flip-flop type sense amplifiers provided for the respective bit line pairs, for differentially amplifying a potential difference on the corresponding bit line pair, and means for activating said current-mirror amplifier means before the corresponding one of said flip-flop type sense amplifiers is activated, and wherein said current-mirror amplifier means comprises:

first and second voltage amplification means for applying an amplified signal corresponding to the difference between voltages on the bit lines of said selected bit line pair, said first and second voltage amplification means including means for directly receiving and detecting said voltage difference and means for converting first and second currents to said amplified signal, and means responsive to said first and second voltage amplification means for controlling said first and second currents and including a positive feedback signal flow path between said first and second voltage amplification means, to increase a rate of voltage change of said first and second voltage amplification means.

10. A semiconductor memory device in accordance with claim 9, wherein a single address input means is used in common as said row address input means and said column address input means, and said externally applied row address and column address are applied to said single address input means in a time-division manner.

11. A semiconductor memory device in accordance with claim 9, wherein said row address input means and said column address input means are provided separately, and said row selection means and said column selection means are activated in response to the same control signal.

12. A semiconductor memory device in accordance with claim 9, wherein said pair of read-out data transferring bus lines comprises:

a plurality of pairs of sub read-out data transferring bus lines, each pair being provided in common for a predetermined number of bit line pairs, and constituting output nodes of the amplifier means provided for each of said predetermined number of bit line pairs, and a pair of main read-out data transferring bus lines connected to all of said plurality of pairs of sub read-out data transferring buses, for receiving a signal on the pair of the sub read-out transferring bus lines constituting the output nodes of the amplifier means which are activated.

13. A semiconductor memory device in accordance with claim 9, wherein said amplifier means comprises first, second, third and fourth MOS transistors of a first conductivity type, and first and second MOS transistors of a second conductivity type;

a drain of the first MOS transistor of the second conductivity type is connected to a first power supply, and a gate and a source thereof are connected to a first output node;

a drain of the second MOS transistor of the second conductivity type is connected to said first power supply, a gate thereof is connected to said first output node and a source thereof is connected to a second output node;

a drain of the first MOS transistor of the first conductivity type is connected to said first output node, a gate thereof is connected to a bit line of the corresponding pair and a source thereof is connected to a first internal node;

a drain of the second MOS transistor of the first conductivity type is connected to said second output node, a gate thereof is connected to the other bit line of said corresponding pair and a source thereof is connected to a second internal node;

a drain of the third MOS transistor of the first conductivity type is connected to said first internal node, a gate thereof is connected to an output signal of said column selection means and a source thereof is connected to a second power supply; and a drain of the fourth MOS transistor of the first conductivity type is connected to said second internal node, a gate thereof is connected to the output signal of said column selection means and a source thereof is connected to said second power supply.

* * * * *